(12) United States Patent
Hou et al.

(10) Patent No.: US 11,973,092 B2
(45) Date of Patent: Apr. 30, 2024

(54) DETECTION SUBSTRATE, MANUFACTURING METHOD THEREOF AND FLAT PANEL DETECTOR

(71) Applicants: Beijing BOE Sensor Technology Co., Ltd., Beijing (CN); BOE Technology Group Co., Ltd., Beijing (CN)

(72) Inventors: Xuecheng Hou, Beijing (CN); Jianxing Shang, Beijing (CN); Xiaobin Shang, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 371 days.

(21) Appl. No.: 17/289,783

(22) PCT Filed: Jul. 22, 2020

(86) PCT No.: PCT/CN2020/103626
§ 371 (c)(1),
(2) Date: Apr. 29, 2021

(87) PCT Pub. No.: WO2021/114670
PCT Pub. Date: Jun. 17, 2021

(65) Prior Publication Data
US 2022/0310683 A1    Sep. 29, 2022

(30) Foreign Application Priority Data
Dec. 13, 2019    (CN) .......................... 201911284923.3

(51) Int. Cl.
*H01L 27/146*    (2006.01)

(52) U.S. Cl.
CPC .. *H01L 27/14605* (2013.01); *H01L 27/14616* (2013.01); *H01L 27/14658* (2013.01); *H01L 27/14689* (2013.01)

(58) Field of Classification Search
CPC ......... H01L 27/14605; H01L 27/14616; H01L 27/14658; H01L 27/14689; H01L 29/66969; H01L 29/78606; H01L 29/7869
See application file for complete search history.

(56) References Cited

U.S. PATENT DOCUMENTS 9,035,301 B2 *   5/2015   Takahashi ......... H01L 27/14663
                                                              257/43
9,159,837 B2 *   10/2015  Yamazaki ............. H01L 29/513
(Continued)

FOREIGN PATENT DOCUMENTS

CN     105244383 A    1/2016
CN     110034135 A    7/2019
(Continued)

*Primary Examiner* — Jarrett J Stark
(74) *Attorney, Agent, or Firm* — ArentFox Schiff LLP; Michael Fainberg

(57) ABSTRACT

The present disclosure discloses a detection substrate, a manufacturing method thereof and a flat panel detector. The detection substrate includes: a base substrate, as well as a plurality of transistors, an oxide layer, a plurality of read electrodes and a plurality of photoelectric conversion structures sequentially on the base substrate, wherein a first electrode of each of the transistors is electrically connected with each of the photoelectric conversion structures in a one-to-one correspondence mode via each of the read electrodes; a material of an active layer includes an oxide; each of the photoelectric conversion structures includes an N-type semiconductor layer, an intrinsic semiconductor layer, and a P-type semiconductor layer; and the oxide layer at least covers channel regions of the transistors and is insulated from the read electrodes.

13 Claims, 17 Drawing Sheets

(56) References Cited

U.S. PATENT DOCUMENTS

| | | | |
|---|---|---|---|
| 9,490,366 B2* | 11/2016 | Yan | H01L 29/78618 |
| 9,748,291 B2* | 8/2017 | Ikeda | H01L 29/24 |
| 9,899,420 B2* | 2/2018 | Yamazaki | H01L 27/1225 |
| 2008/0303020 A1* | 12/2008 | Shin | H01L 29/66969 |
| | | | 257/E29.151 |
| 2010/0283067 A1* | 11/2010 | Murakami | H01L 27/1248 |
| | | | 257/E33.053 |
| 2010/0320556 A1 | 12/2010 | Tredwell | |
| 2013/0082252 A1* | 4/2013 | Yamazaki | H01L 29/66969 |
| | | | 257/E21.409 |
| 2015/0340511 A1* | 11/2015 | Yan | H01L 27/1225 |
| | | | 257/43 |
| 2017/0069673 A1* | 3/2017 | Ikeda | H01L 27/14616 |
| 2017/0148834 A1* | 5/2017 | Tomyo | H01L 27/124 |
| 2019/0035935 A1* | 1/2019 | Nakazawa | H01L 27/15 |
| 2019/0187305 A1 | 6/2019 | Yi et al. | |
| 2020/0259034 A1* | 8/2020 | Huang | H01L 31/105 |
| 2020/0411608 A1* | 12/2020 | Tang | H10K 59/126 |
| 2021/0050469 A1* | 2/2021 | Zhou | H01L 31/02161 |
| 2021/0248341 A1* | 8/2021 | Lin | H10K 59/65 |
| 2021/0405216 A1* | 12/2021 | Liang | H01L 27/1462 |
| 2022/0293663 A1* | 9/2022 | Mochizuki | H01L 27/146 |
| 2023/0116284 A1* | 4/2023 | Zhan | H01L 27/14612 |
| | | | 250/208.1 |

FOREIGN PATENT DOCUMENTS

| | | |
|---|---|---|
| CN | 110391308 A | 10/2019 |
| CN | 210575956 U | 5/2020 |
| CN | 111244119 A | 6/2020 |

* cited by examiner

DETECTION SUBSTRATE, MANUFACTURING METHOD THEREOF AND FLAT PANEL DETECTOR

CROSS-REFERENCE TO RELATED APPLICATIONS

The present disclosure is a National Stage of International Application No. PCT/CN2020/103626, filed on Jul. 22, 2020, which claims priority to Chinese Patent Application No. 201911284923.3, filed to China National Intellectual Property Administration on Dec. 13, 2019, both of which are hereby incorporated by reference in their entirety.

FIELD

The present disclosure relates to the field of photoelectric detection technology, in particular to a detection substrate, a manufacturing method thereof and a flat panel detector.

BACKGROUND

The X-ray detection technology is widely used in the fields of industrial non-destructive test, container scanning, circuit board inspection, medical, security and protection, industry, etc. and has wide application prospects. Traditional X-Ray imaging techniques belong to analog signal imaging, with low resolution and poor image quality. X-ray Digital Radio Graphy (DR), which emerged in the late 1990s, employs an X-ray flat panel detector to directly convert X images into digital images, and has become a hot spot under current study due to the fact that the converted digital images are clear, has high resolution and is easy to be stored and transmitted. Depending on different structures, X-ray flat panel detectors are classified into a direct-conversion type (Direct DR) and an indirect-conversion type (Indirect DR). Indirect-conversion type X-ray flat panel detectors have the advantages of being mature in technology, relatively low in cost, high in Detective Quantum Efficiency (DQE), good in reliability, etc., thereby being widely developed and applied.

An X-ray flat panel detector mainly includes a Thin Film Transistor (TFT) and a photodiode (PIN). Under X-ray irradiation, a scintillator layer or a phosphor layer of the indirect-conversion type X-ray flat panel detector converts X-ray photons into visible light, then converts the visible light into an electrical signal under the action of the PIN, and finally the electrical signal is read by the TFT and output to obtain a display image.

In the related art, the TFT included in the flat panel detector may be an amorphous silicon (a-Si) TFT. However, the a-Si TFT has the disadvantages of low mobility, large intrinsic size, etc., resulting in low frame rate and low pixel fill rate of this type of flat panel detector. An oxide TFT typified by an amorphous indium gallium zinc oxide (a-IGZO) TFT has superior performance, such as high mobility, high transparency, small size, low fabrication temperature and low cost, so that a flat panel detector including the a-IGZO TFT has a high frame rate and a high pixel fill rate. During fabrication of the flat panel detector including the a-IGZO TFT, it is generally necessary to deposit a PIN film layer on the a-IGZO TFT. However, hydrogen atoms (H Plasma) diffuse into a channel region of the a-IGZO TFT during the deposition of the PIN film layer, causing poor stability of the a-IGZO TFT, which then affects the performance of the flat panel detector.

SUMMARY

An embodiment of the present disclosure provides a detection substrate, including:

a base substrate;
a plurality of transistors on the base substrate;
a plurality of read electrodes on a side of each of the transistors away from the base substrate;
a plurality of photoelectric conversion structures on a side of each of the read electrodes away from the transistors, and
an oxide layer between a layer with each of the transistors and a layer with each of the read electrodes; wherein:
a first electrode of each of the transistors is electrically connected with each of the photoelectric conversion structures in a one-to-one correspondence mode via each of the read electrodes; a material of an active layer of each of the transistors includes an oxide;
each of the photoelectric conversion structures includes: an N-type semiconductor layer, an intrinsic semiconductor layer, and a P-type semiconductor layer; and
the oxide layer at least covers channel regions of the transistors and is insulated from the read electrodes.

In one possible implementation, the detection substrate provided by the embodiments of the present disclosure further includes: an insulating layer between the layer with each of the transistors and the layer with each of the read electrodes; and the first electrode of the transistor is electrically connected with the read electrode through a first via penetrating through the insulating layer; and the oxide layer has a hollow-out structure in a region where the first via is located.

In one possible implementation, in the detection substrate provided by the embodiments of the present disclosure, the insulating layer includes: a first passivation layer between the layer with each of the transistors and the oxide layer, a first resin layer between the oxide layer and the layer with each of the read electrodes, and a second passivation layer between the first resin layer and the layer with each of the read electrodes.

In one possible implementation, in the detection substrate provided by the embodiments of the present disclosure, the insulating layer includes: the first passivation layer between the layer with each of the transistors and the oxide layer, a first resin layer between the oxide layer and the first passivation layer, and a second passivation layer between the oxide layer and the layer with each of the read electrodes.

In one possible implementation, in the detection substrate provided by the embodiments of the present disclosure, the first resin layer has a second via in a region where a second electrode of the transistor is located, and the second passivation layer covers the second via and the read electrode at least covers part of the second via.

In one possible implementation, in the detection substrate provided by the embodiments of the present disclosure, an orthographic projection of the oxide layer onto the base substrate covers an orthographic projection of the second via onto the base substrate.

In one possible implementation, in the detection substrate provided by the embodiments of the present disclosure, a region with the transistor and the photoelectric conversion structure electrically connected is a pixel region; and the oxide layer corresponding to each pixel region is of an integrated structure.

In one possible implementation, in the detection substrate provided by the embodiments of the present disclosure, a region with the transistor and the photoelectric conversion structure electrically connected is a pixel region; and the respective oxide layers corresponding to the respective pixel regions are independent from one another.

In one possible implementation, in the detection substrate provided by the embodiments of the present disclosure, the channel region of the transistor is in a central region of the oxide layer within each of the pixel regions.

In one possible implementation, in the detection substrate provided by the embodiments of the present disclosure, a material of the oxide layer is indium tin oxide.

In one possible implementation, in the detection substrate provided by the embodiments of the present disclosure, the material of the active layer of each of the transistors is indium gallium zinc oxide.

Based on the same inventive concept, an embodiment of the present disclosure provides a flat panel detector, including: the detection substrate.

Based on the same inventive concept, an embodiment of the present disclosure also provides a manufacturing method of the detection substrate, including:

providing a base substrate; and sequentially forming a plurality of transistors, an oxide layer, a plurality of read electrodes, and a plurality of photoelectric conversion structures on the base substrate; wherein a first electrode of each of the transistors is electrically connected with each of the photoelectric conversion structures in a one-to-one correspondence mode via each of the read electrodes; a material of an active layer of each of the transistors includes an oxide;

each of the photoelectric conversion structures includes: an N-type semiconductor layer, an intrinsic semiconductor layer, and a P-type semiconductor layer; and the oxide layer at least covers channel regions of the transistors and is insulated from the read electrodes.

In one possible implementation, the manufacturing method provided by the embodiments of the present disclosure, after forming the plurality of transistors on the base substrate and before forming the plurality of read electrodes, further includes: forming a first passivation layer on a layer with each of the transistors, wherein the first passivation layer has a via in a region with the first electrode of each of the transistors.

In one possible implementation, the manufacturing method provided by the embodiments of the present disclosure, after forming the oxide layer and before forming the plurality of read electrodes, further includes:

sequentially forming the first passivation layer, a first resin layer, and a second passivation layer;

wherein the first passivation layer has a first via penetrating through the first resin layer and the second passivation layer in a region with the first electrode of each of the transistors, and the first resin layer has a second via in a region with a second electrode of each of the transistors.

In one possible implementation, in the manufacturing method provided by the embodiments of the present disclosure, forming the oxide layer includes:

after forming the first passivation layer, and before forming the first resin layer, forming the oxide layer with a hollow-out structure in a region where the first via is located;

alternatively after forming the first resin layer and before forming the second passivation layer, forming the oxide layer with a hollow-out structure in a region where the first via is located.

DETAILED DESCRIPTION OF THE EMBODIMENTS

Figure 1:
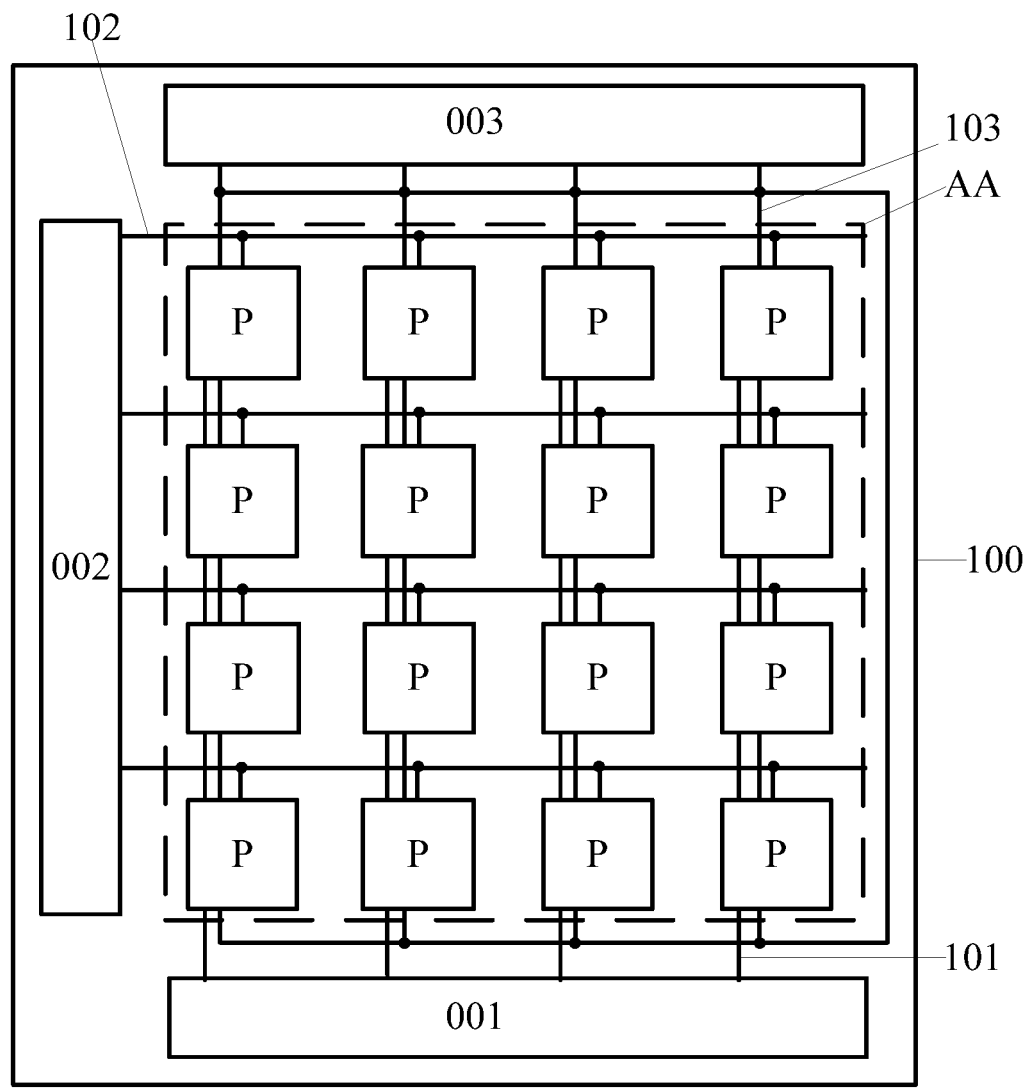
FIG. 1 is a schematic diagram of a top-view structure of a detection substrate according to an embodiment of the present disclosure.

In order to make the objectives, technical solutions and advantages of embodiments of the present disclosure clearer, the technical solutions of the embodiments of the present disclosure will be clearly and completely described below in conjunction with the accompanying drawings of the embodiments of the present disclosure. A thickness and a shape of each of film layers in the drawings do not reflect the true scale and are intended to merely illustrate the contents of the present disclosure. Clearly, the described embodiments are some, but not all, embodiments of the present disclosure. Based on the described embodiments of the present disclosure, all other embodiments obtained by those ordinarily skilled in the art without inventive work fall within the protection scope of the present disclosure.

Unless otherwise defined, technical or scientific terms used herein are to be taken as commonly understood by a person of ordinary skill in the art to which the present disclosure belongs. The terms "first", "second", and the like, as used in the description and in the claims of the present disclosure, do not denote any order, quantity, or importance, but are merely used to distinguish one component from another. The word "including" or "containing" and the like means that elements or items preceding the word appear to encompass elements or items and equivalents thereof listed after the word without excluding other elements or items. "Inner", "outer", "upper", "lower" and the like are only used to indicate relative positional relationships, which may change accordingly when an absolute position of an described object changes.

An embodiment of the present disclosure provides a detection substrate, as shown in FIG. 1, including: a base substrate 100; a source driver 001, a gate driver 002, a bias voltage apparatus 003, a data line 101, a gate line 102 and a bias line 103 on the base substrate 100, and a plurality of pixel cells P in a detection region AA.

The source driver 001 provides a switching signal for the data line 101.

The gate driver 002 provides a scan signal for the gate line 102.

The bias voltage apparatus 003 provides a bias voltage signal for the bias line 103.

Figure 2:
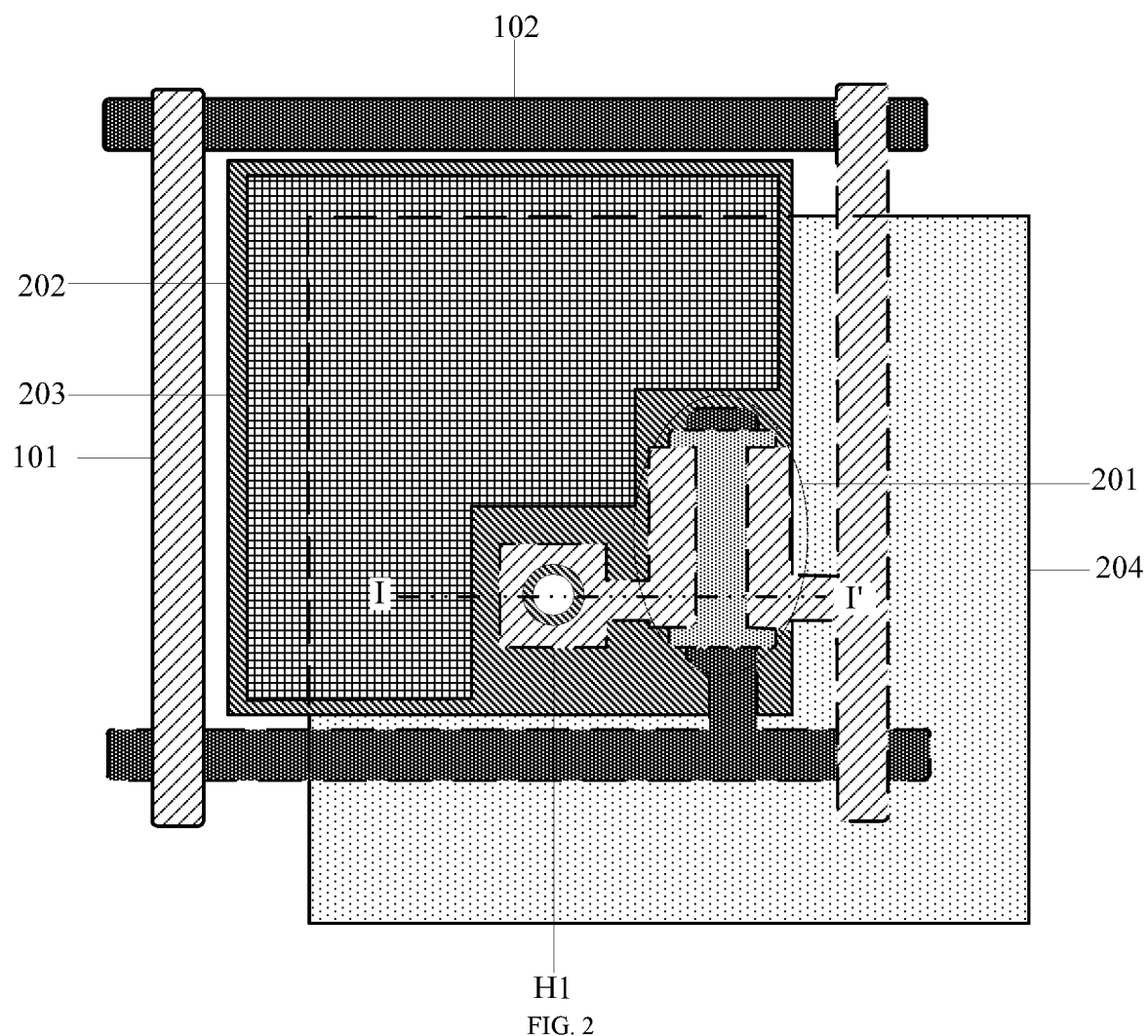
FIG. 2 is a schematic diagram of a top-view structure of a pixel cell on the detection substrate shown in FIG. 1.
Figure 3:
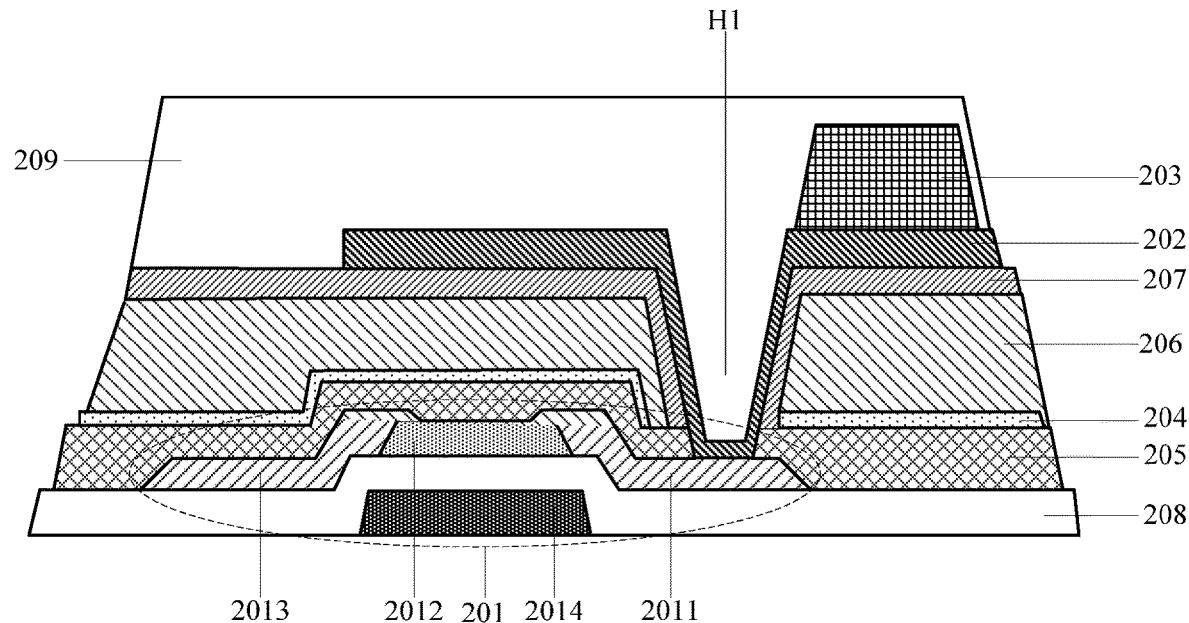
FIGS. 3 and 4 are schematic diagrams of sectional structures along a line I-I' of FIG. 2 respectively.
Figure 4:
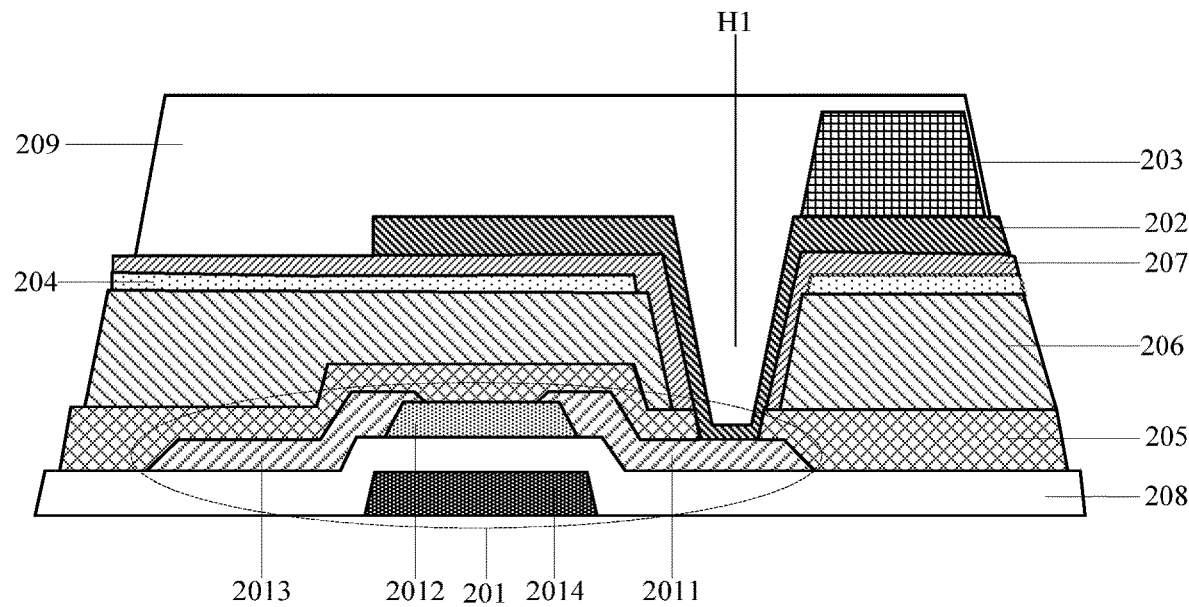

The plurality of pixel cells P include: a plurality of transistors 201 on the base substrate 100, a plurality of read electrodes 202 above a layer with each of the transistors 201, a plurality of photoelectric conversion structures 203 above a layer with each of the read electrodes 202, and an oxide layer 204 between the layer with each of the transistors 201 and the layer with each of the read electrodes 202. FIGS. 2 to 4 illustrate a structure of one pixel cell P.

A first electrode 2011 of each of the transistors 201 is electrically connected with each of the photoelectric conversion structures 203 in a one-to-one correspondence mode through each of the read electrodes 202. A material of an active layer 2012 of each of the transistors 201 includes an oxide, such as indium gallium zinc oxide (IGZO), and the active layer 2012 made of IGZO has excellent carrier mobility and can improve a reading rate of detection data and can achieve dynamic real-time detection. Each of the active layers 2012 includes a channel region, as well as a first electrode contact region and a second electrode contact region on two sides of the channel region.

the photoelectric conversion structure 203 includes: an N-type semiconductor layer with an N-type impurity, an intrinsic semiconductor layer without an impurity, and a P-type semiconductor layer with a P-type impurity sequentially stacked on the read electrode 202; or, includes: the P-type semiconductor layer with the P-type impurity, the intrinsic semiconductor layer without impurity, and the N-type semiconductor layer with the N-type impurity sequentially stacked on the read electrode 202. A thickness of the intrinsic semiconductor layer may be greater than a thickness of the P-type semiconductor layer and a thickness of the N-type semiconductor layer. The photoelectric conversion structure 203 can convert an optical signal into an electrical signal, and transmit the electrical signal to the transistor 201 through the read electrodes 202, and then the electrical signal is converted into an image signal after being read out through a data line 101. The read electrodes 202 may be formed from molybdenum, aluminum, silver, copper, titanium, platinum, tungsten, tantalum, tantalum nitride, alloys thereof, and combinations thereof, or other suitable materials.

The oxide layer 204 at least covers the channel region of the transistor 201 and is insulated from the read electrode 202. Optionally, the oxide layer 204 may be made of any material, such as indium tin oxide, indium zinc oxide, indium gallium zinc oxide, or the like, susceptible to bonding with hydrogen atoms, which is not limited here.

In general, each of the pixel cells P further includes: a bias voltage electrode (not shown in figures) above the photoelectric conversion structure 203, wherein there is facing overlap region between the bias voltage electrode and the read electrode 202, and a storage capacitor can be formed between the bias voltage electrode and the read electrode 202. The electrical signal converted by the photoelectric conversion structure 203 can be stored in the storage capacitor. In particular, the bias voltage electrode may be formed from a transparent material such as indium tin oxide (ITO) or indium zinc oxide (IZO) to improve the light transmittance.

In addition, an orthographic projection of the bias voltage electrodes onto the base substrate 100 lies within an orthographic projection of the photoelectric conversion structures 203 onto the base substrate 100, i.e., the area of each of the bias voltage electrodes is slightly smaller than the area of each of the photoelectric conversion structures 203. Optionally, a distance between the edge of the bias voltage electrode and the edge of the photoelectric conversion structure 203 is 1 μm to 3 μm, e.g., 1.0 μm, 1.5 μm, 1.8 μm, 2.0 μm, 2.5 μm, 3.0 μm, etc. By the above arrangement, leakage current of a PIN sidewall due to its damage caused by etching of the bias voltage electrode can be reduced.

Optionally, the base substrate 100 may be a flexible base substrate, such as a plastic substrate with excellent heat resistance and durability and made of polyvinyl ether phthalate, polyethylene naphthalate, polycarbonate, polyarylate, polyetherimide, polyethersulfone, or polyimide, etc., or may also be a rigid base substrate, e.g., a glass base substrate, which is not limited here.

In the detection substrate provided by the embodiments of the present disclosure, the oxide layer 204 at least covering the channel regions of the transistors 201 is arranged between a layer with each of the transistors 201 and a layer with each of the read electrodes 202, so that hydrogen atoms generated during subsequent deposition of the photoelectric conversion structures 203 are allowed to react with and thereby be consumed by the oxide layer 204, avoiding the hydrogen atoms reaching the channel regions, effectively improving the stability of the transistors 201 and improving the performance of a flat panel detector. Preferably, in order to better avoid the influence of the hydrogen atoms on the channel regions, an oxide layer 204 may be arranged to cover regions of the pixel cells P where the transistors 201 are located. In addition, it should be understood that the oxide layer 204 reacts with the hydrogen atoms as a sacrificial layer, and thus, the oxide layer 204 may float without loading the oxide layer 204 with any electrical signal. In addition, the floating oxide layer 204 floated does not form parasitic capacitance with the transistors 201 or the read electrodes 202, avoiding undesirable effects of the oxide layer 204 on the transistors 201 or the read electrodes 202.

Optionally, in the detection substrate provided by the embodiments of the present disclosure, as shown in FIGS. 3 and 4, each of the transistors 201 may further include: a second electrode 2013 and a gate 2014. The transistor 201 may be of a bottom-gate structure (as illustrated in FIGS. 3 and 4) or may be of a top-gate structure. In the condition that the transistor 201 is of a top-gate structure, the gate 2014 can protect the active layer 2012 against the influence of the hydrogen atoms to some extent. Moreover, the first electrode 2011, the second electrode 2013, and the gate 2014 may be fabricated from molybdenum, aluminum, silver, copper, titanium, platinum, tungsten, tantalum, tantalum nitride, alloys thereof, combinations thereof, or other suitable materials. Besides, the first electrode 2011 and the second electrode 2013 of each of the transistors 201 are a drain and a source respectively, and functions of the first electrode 2011 and the second electrode 2013 can be interchanged depending on the transistor type and difference of input signals, and are not particularly distinguished here. Typically, when the transistor is a P-type transistor, the first electrode 2011 is the source and the second electrode 2013 is the drain. When the transistor is an N-type transistor, the first electrode 2011 is the drain and the second electrode 2013 is the source.

To simplify a manufacturing process, save manufacturing cost, and improve the production efficiency, the gate line 102 and gates 2014 can be prepared simultaneously by using one patterning process. Of course, two patterning processes may be employed to separately prepare the gate line 102 and the gates 2014, which is not limited here. The first electrodes 2011, the second electrodes 2013, and the data line 101 may also be prepared simultaneously by using one patterning process. Of course, two patterning processes may be employed to prepare the first electrodes 2011, the second electrodes 2013 and the data line 101 respectively, which is not limited here.

Typically, the bias line 103 is on the side of the layer with the bias voltage electrodes away from the base substrate 101, and a protective layer (not shown) is on the side of the bias line 103 away from the base substrate 101. The bias line 103 runs through a detection region AA in the direction of the data line 101 and may be a transparent material, e.g., indium tin oxide (ITO) or indium zinc oxide (IZO), etc., or may be a metal material, e.g., molybdenum, aluminum, silver, copper, titanium, platinum, tungsten, tantalum, tantalum nitride, alloys thereof, combinations thereof, or other suitable materials. When the transparent material is used, the bias line 103 above the photoelectric conversion structures 203 does not block light rays, effectively increasing the fill rate. At the same time, the bias line 103 and ITO in a bonding region may be fabricated by one patterning process, saving process flow. When the metal material is used, the resistance of the bias line 103 can be effectively reduced, ensuring higher bias uniformity in the whole detection region AA. Also, in order to guarantee a higher fill rate, an orthographic projection of the bias line of the metal material onto the base substrate 100 and an orthographic projection of the active layer 2012 onto the base substrate 100 do not overlap each other. Of course, the orthographic projection of the bias lines 103 of transparent material onto the base substrate 100 and the orthographic projection of the active layer 2012 onto the base substrate 100 may not overlap each other, guaranteeing the higher fill rate and reducing production cost.

Optionally, a scintillator layer 108 on the side of the protective layer away from the base substrate 101 may also be included. A material of the scintillator layer 108 is capable of converting X-rays to visible light, e.g., CsI:Tl, $Gd_2O_2S$:Tb, etc., or others possibly like CsI:Na, $CaWO_4$, $CdWO_4$, NaI:Tl, $BaFCl$:$Eu^{2+}$, $BaSO_4$:$Eu^{2+}$, $BaFBr$:$Eu^{2+}$, LaOBr:$Tb^{3+}$, LaOBr:$Tm^{3+}$, $La_2O_2S$:$Tb^{3+}$, $YTaO_4$, $YTaO_4$:Nb, ZnS:Ag, $ZnSiO_4$:$Mn^{2+}$, $CeF_3$, etc. The visible light converted from X-rays on scintillating crystals included in the scintillator layer 108 has a wavelength peak between 530 nm and 580 nm and a spectral range reaching 350 nm to 700 nm. This light has a very short delay effect and can attenuate to less than 1% of irradiation brightness of the X-rays within 1 ms after the X-rays disappear.

Optionally, the detection substrate provided by the embodiments of the present disclosure, as shown in FIGS. 3 and 4, may further include: an insulating layer between the layer with each of the transistors 201 and the layer with each of the read electrodes 202.

The first electrode 2011 of each of the transistors 201 is electrically connected with the read electrode 202 through a first via H1 penetrating through the insulating layer.

The oxide layer 204 has a hollow-out structure in a region where the first via H1 is located.

In particular, as shown in FIGS. 3 and 4, the insulating layer includes a first passivation layer 205, a first resin layer 206, and a second passivation layer 207 disposed in a stack. The first passivation layer 205 may be formed by using a single layer of silicon oxide or a stacked structure of silicon oxide/silicon nitride/silicon oxynitride, effectively avoiding the problem of conducting of the channel region included in the active layer 2012 of the IGZO material caused by the first passivation layer 205 manufactured by using a single layer of silicon nitride in the related art.

Additionally, silicon oxide, silicon nitride, and/or silicon oxynitride may be employed to form the second passivation layer 207. As the oxide layer 204 is between the first passivation layer 205 and the first resin layer 206 (as shown in FIG. 3), or the oxide layer 204 is between the second passivation layer 207 and the first resin layer 206 (as shown in FIG. 4), i.e., the oxide layer 204 is between the second passivation layer 207 and the active layer 2012 of the IGZO material, the oxide layer 204 may be combined with the hydrogen atoms generated during deposition of the second passivation layer 207 to avoid contact of the hydrogen atoms with the active layer 2012 of the IGZO material, thereby preventing conducting of the active layer 2012 of the IGZO material and improving the stability of the performance of the transistors 201.

Optionally, a material of the first resin layer 206 may be an organic insulating material such as polyacrylic resin, polyepoxy acrylic resin, photosensitive polyimide resin, polyester acrylate, polyurethane acrylate resin, phenolic epoxy acrylic resin, etc., which is not limited here. During heat curing of the first resin layer 206, a cross-linking reaction product, a solvent, water, etc. is produced in the form of out gas, the oxide layer 204 is disposed between first passivation layer 205 and the first resin layer 206, as shown in FIG. 3, to block diffusion of the product in the form of out gas into the channel region, improving the stability of the transistors 201.

Figure 6:
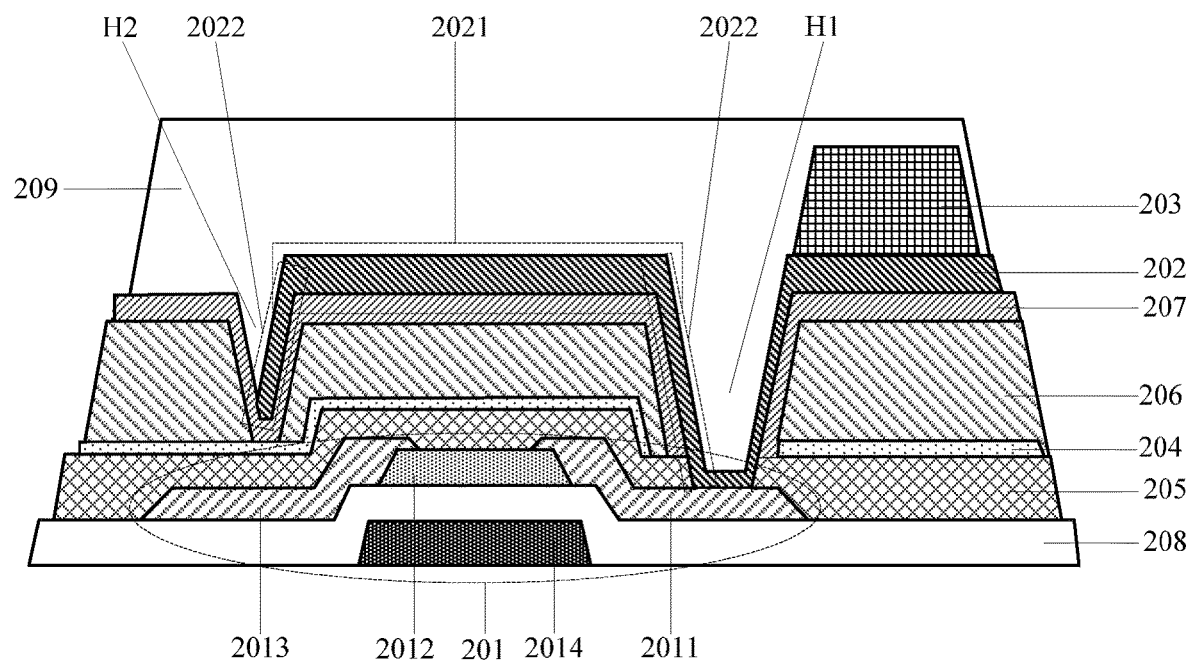
FIGS. 6 and 7 are schematic diagrams of sectional structures along a line II-IP of FIG. 5A respectively.
Figure 7:
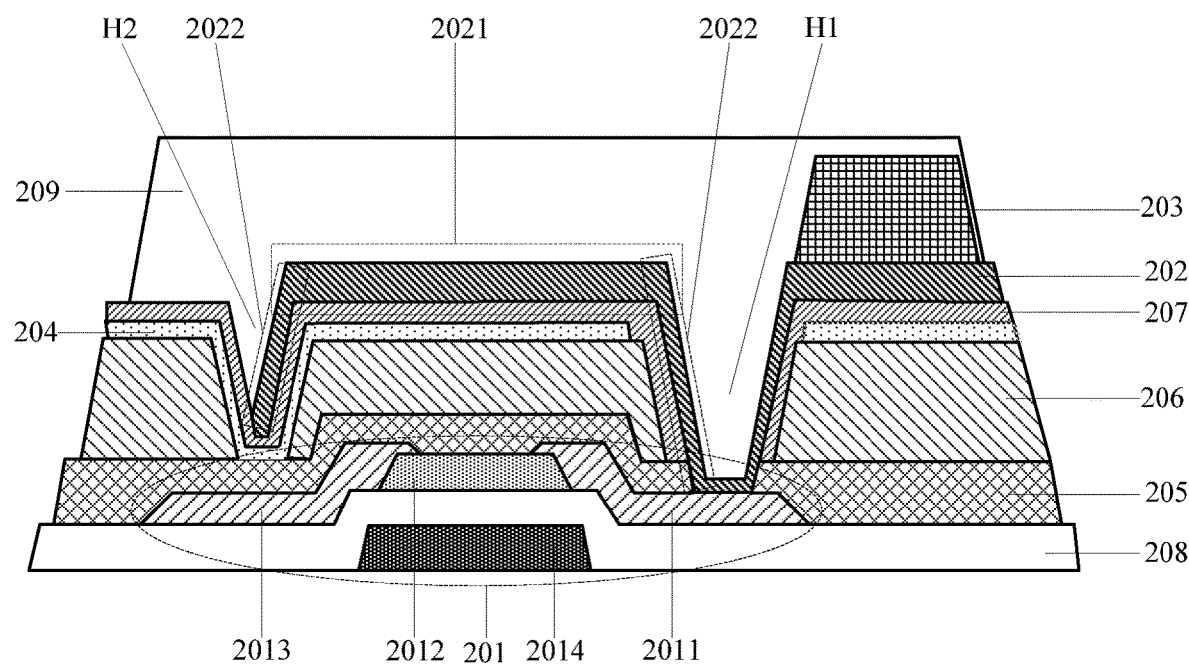
Figure 8:
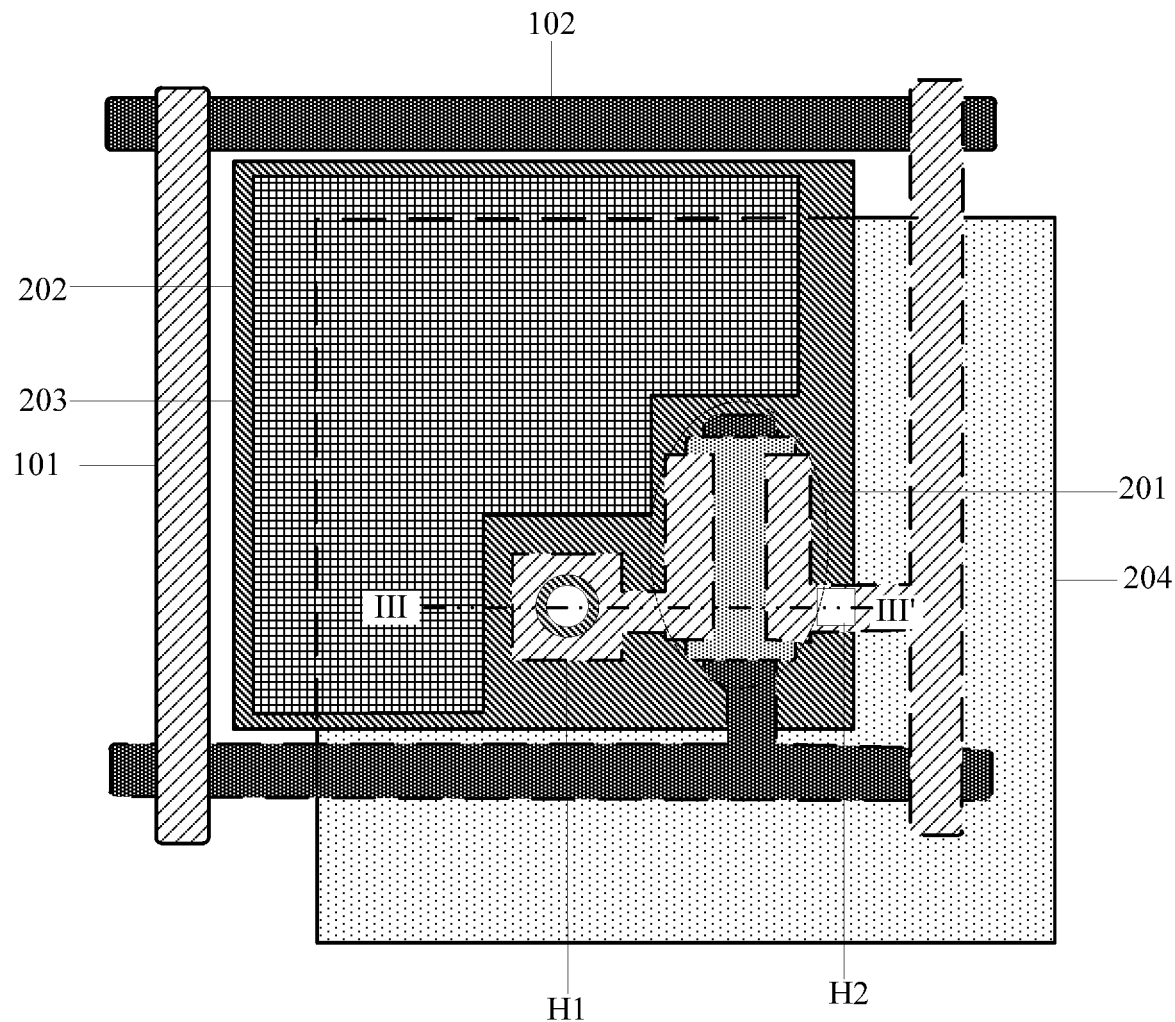
FIG. 8 is a schematic diagram of another top-view structure of a pixel cell on the detection substrate shown in FIG. 1.
Figure 9:
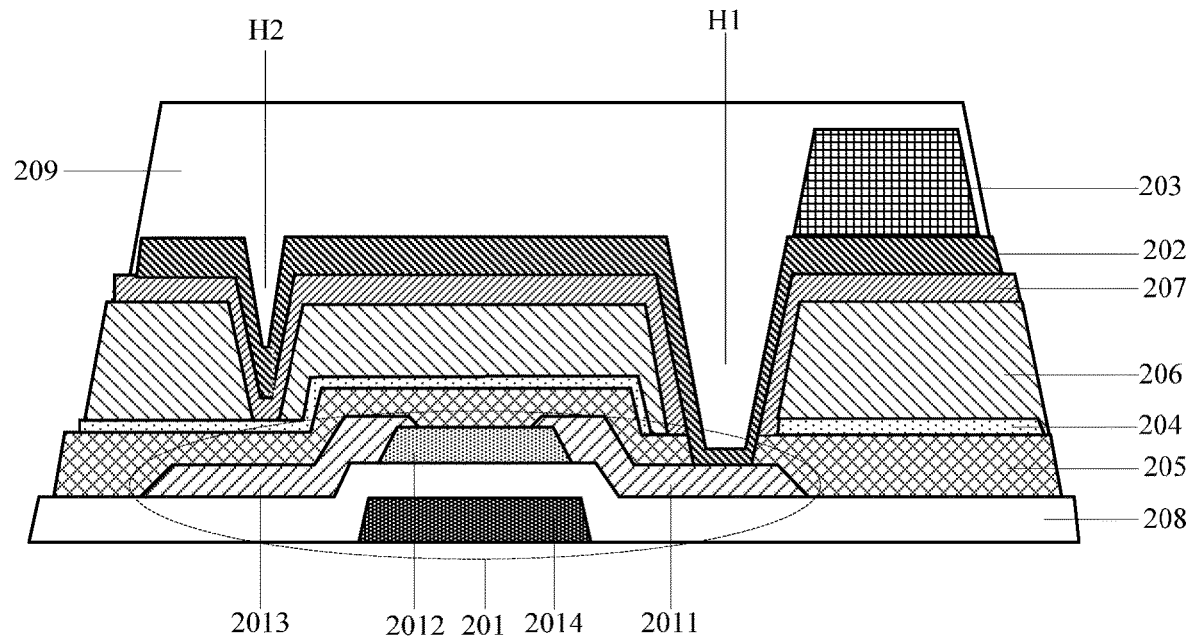
FIGS. 9 and 10 are schematic diagrams of sectional structures along a line of FIG. 8 respectively.
Figure 10:
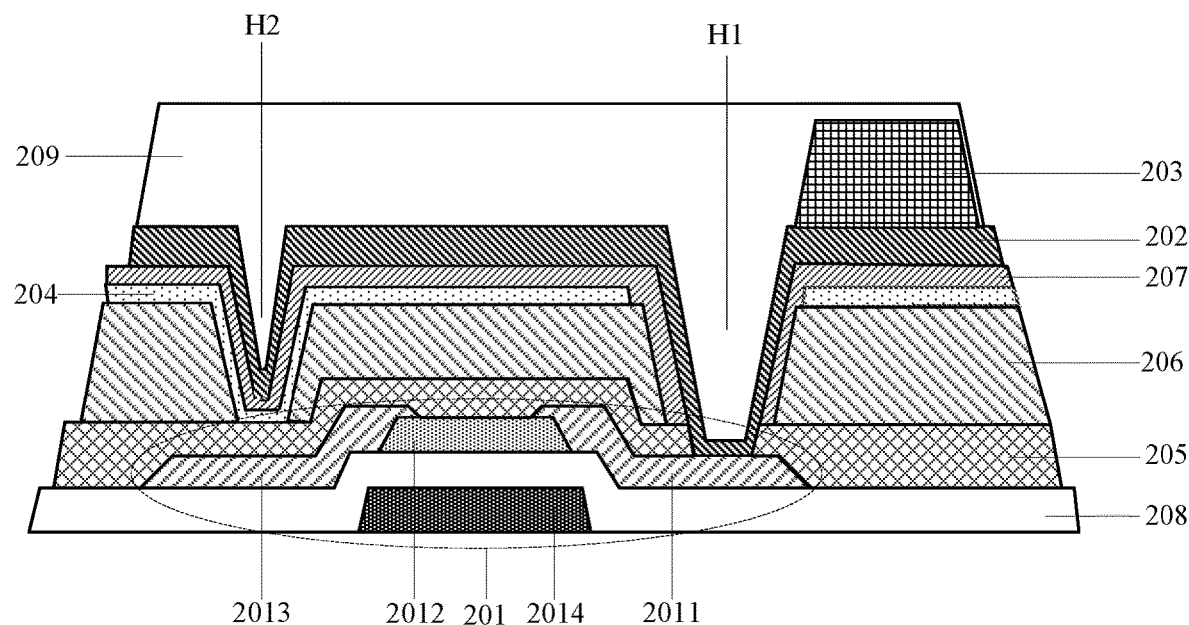

Optionally, in the detection substrate provided by the embodiments of the present disclosure, as shown in FIGS. 5A, 5B, 6 and 7, the first resin layer 206 has a second via H2 in a region where the second electrode 2013 of each of the transistors 201 is located, the second passivation layer 207 covers the second via H2 and the read electrodes 202 cover part of the second via H2; or the read electrodes 202 cover the whole second via H2, as shown in FIGS. 8 to 10.

As shown in FIGS. 5A, 5B, 6 and 7, covering part of the second via H2 by the read electrodes 202, achieves full protection of the active layer 2012 by a first segment 2021 in the read electrodes 202 above the active layer 2012, and a second segment 2022 on two sides of the active layer 2012, from three directions of the top, left and right, further blocks diffusion of the hydrogen atoms to the channel region in subsequent processes, greatly improves the stability of the transistors 201. In addition, the portion of the read electrode 202 covering the transistor 201 can provide a compensation voltage for the transistor 201 to increase a critical voltage of the transistor 201 and reduce leakage current.

As shown in FIGS. 8 to 10, the read electrode 202 cover the whole second via H2, in this case, based on similar principles described above, full protection of the active layer 2012 is also achieved from the three directions of the top, left, and right, further blocking diffusion of the hydrogen atoms to the channel region in subsequent processes, increasing the critical voltage of the transistor 201, reducing the leakage current. In addition, to avoid shorting between the read electrodes 202 contained in adjacent pixel cells P, the portion of the read electrode 202 covering the right side of the second via H2 may be used as a read line.

Optionally, in the detection substrate provided by the embodiments of the present disclosure, as shown in FIGS. 6 and 7, an orthographic projection of the oxide layer 204 onto the base substrate 100 covers an orthographic projection of the second via H2 onto the base substrate 100. In particular, the orthographic projection of the oxide layer 204 onto the base substrate 100 covering the orthographic projection of the second via H2 onto the base substrate 100 means that the oxide layer 204 in a region where the second via H2 is located is not etched. In this way, on the one hand, the hydrogen atoms may be effectively prevented from intruding into the channel region from the left and the top, and on the other hand, an adverse effect on the channel region of the hydrogen atoms which may be generated during etching of the oxide layer 204 in the region where the second via H2 is located is prevented.

Optionally, in the detection substrate provided by the embodiments of the present disclosure, the arrangement of the oxide layer 204 can have the following two possible implementations.

One possible implementation is: a region where each of the transistors 201 and each of the photoelectric conversion structures 203 electrically connected are located is a pixel region. The oxide layers 204 corresponding to the pixel regions are of an integrated structure.

Another possible implementation is: a region where each of the transistors 201 and each of the photoelectric conversion structures 203 electrically connected are located is a pixel region. The oxide layers 204 corresponding to the pixel regions are independent from one another.

Figure 5A:
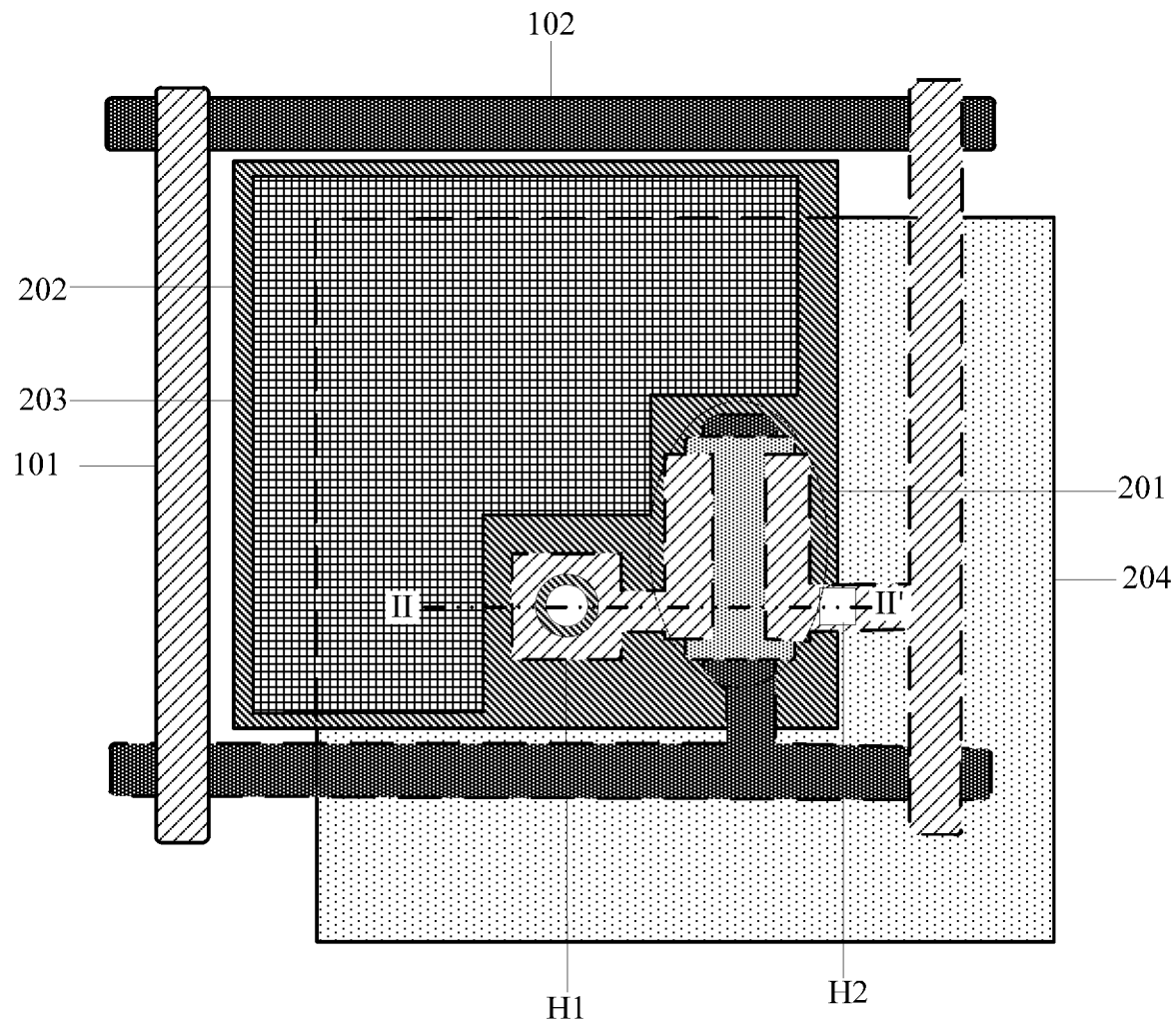
FIGS. 5A and 5B are schematic diagrams of another top-view structure of a pixel cell on the detection substrate shown in FIG. 1 respectively.
Figure 5B:
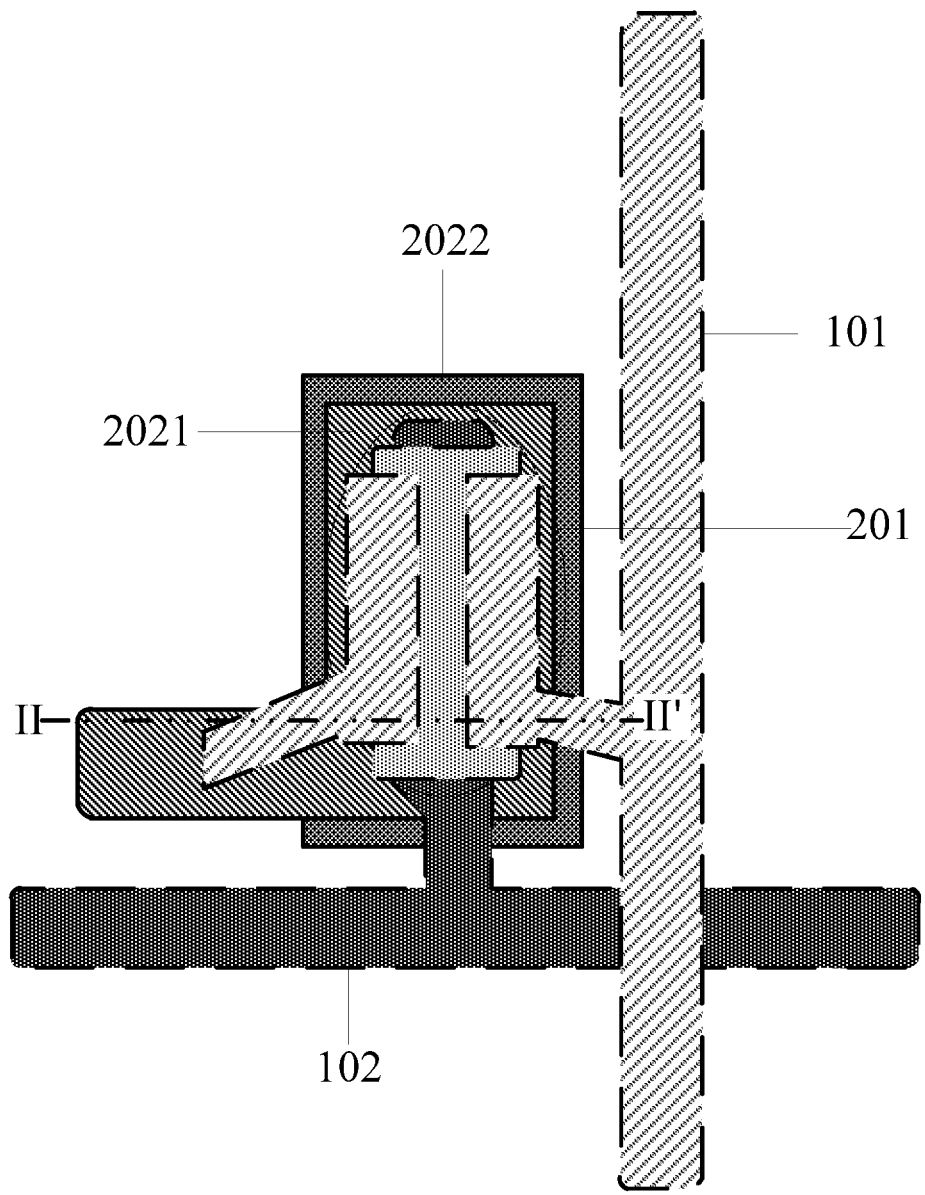

Optionally, in the case where the oxide layers 204 corresponding to the pixel regions are independent from one another, in order to effectively protect the channel region, the transistor 201 may be arranged in a central region of the oxide layer 204 within each of the pixel regions, preferably the channel region of the transistor 201 may be arranged in a central region of the oxide layer 204, as shown in FIG. 5A.

Figure 11:
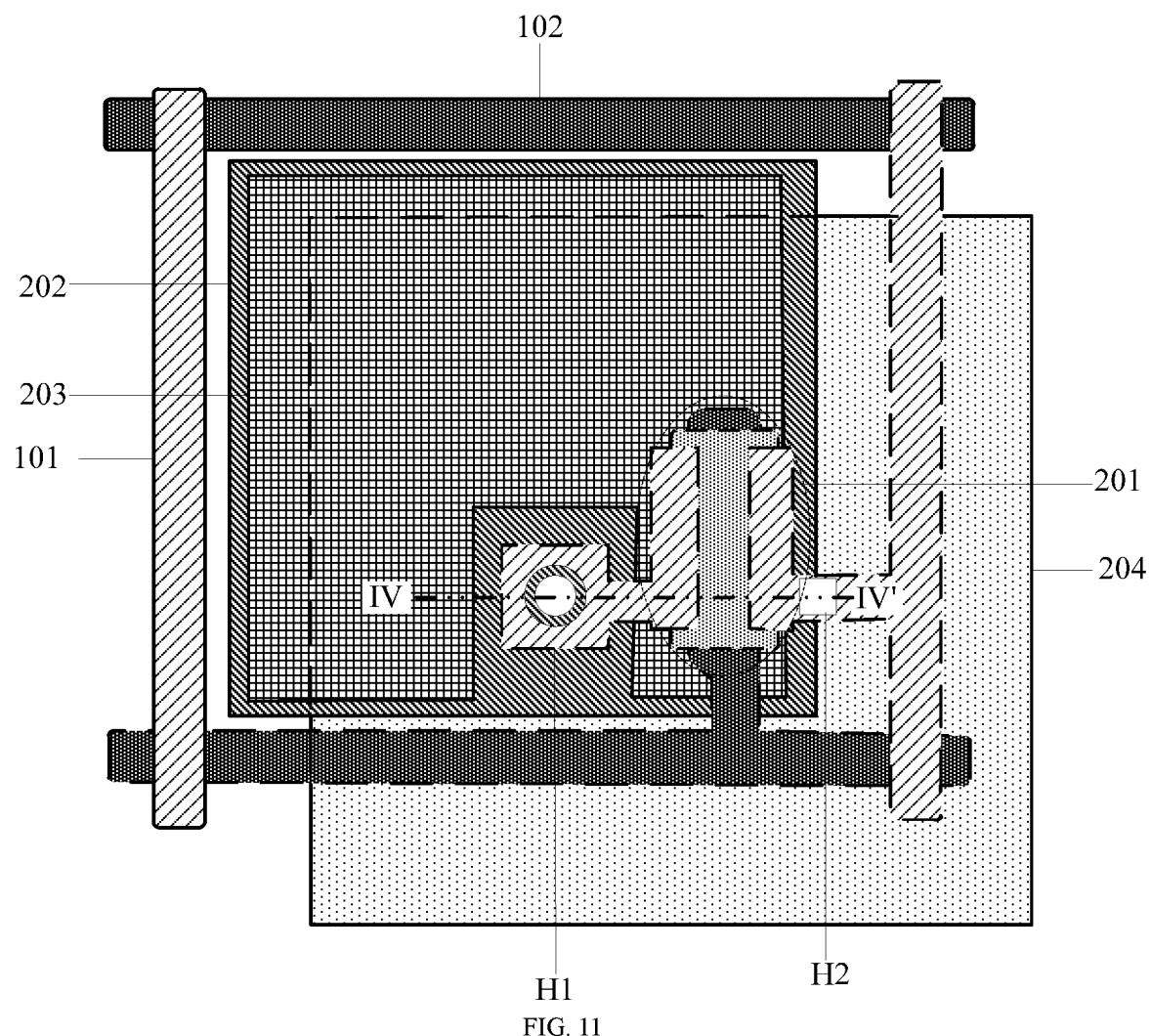
FIG. 11 is a schematic diagram of another top-view structure of a pixel cell on the detection substrate shown in FIG. 1.
Figure 12:
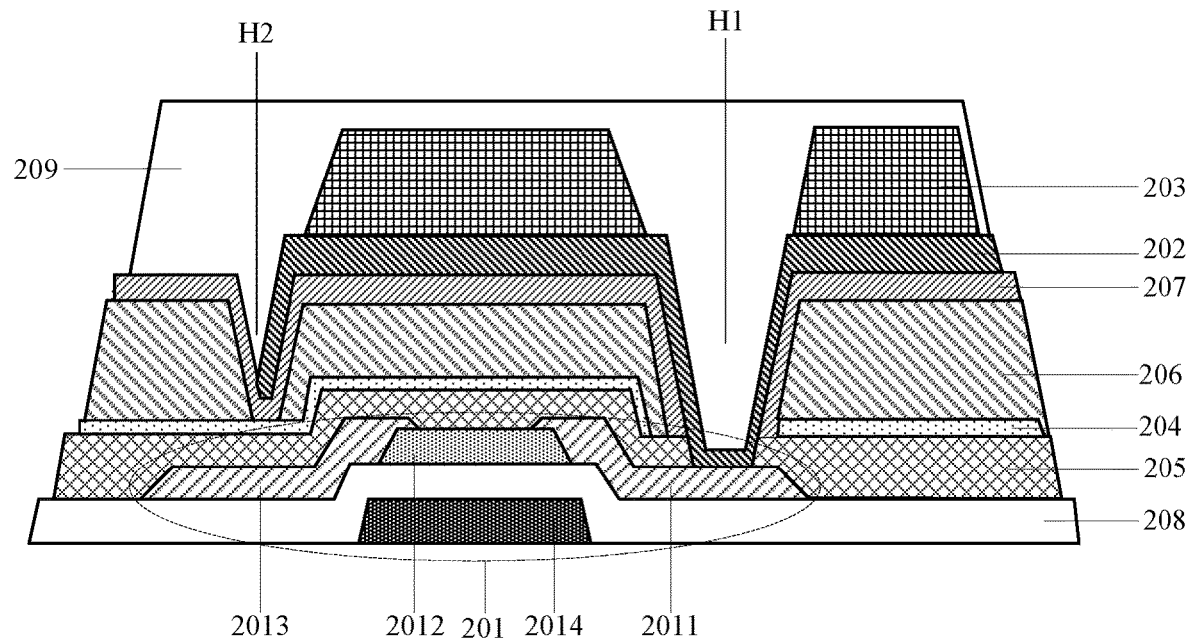
FIGS. 12 and 13 are schematic diagrams of sectional structures along a line IV-IV' of FIG. 11 respectively.
Figure 13:
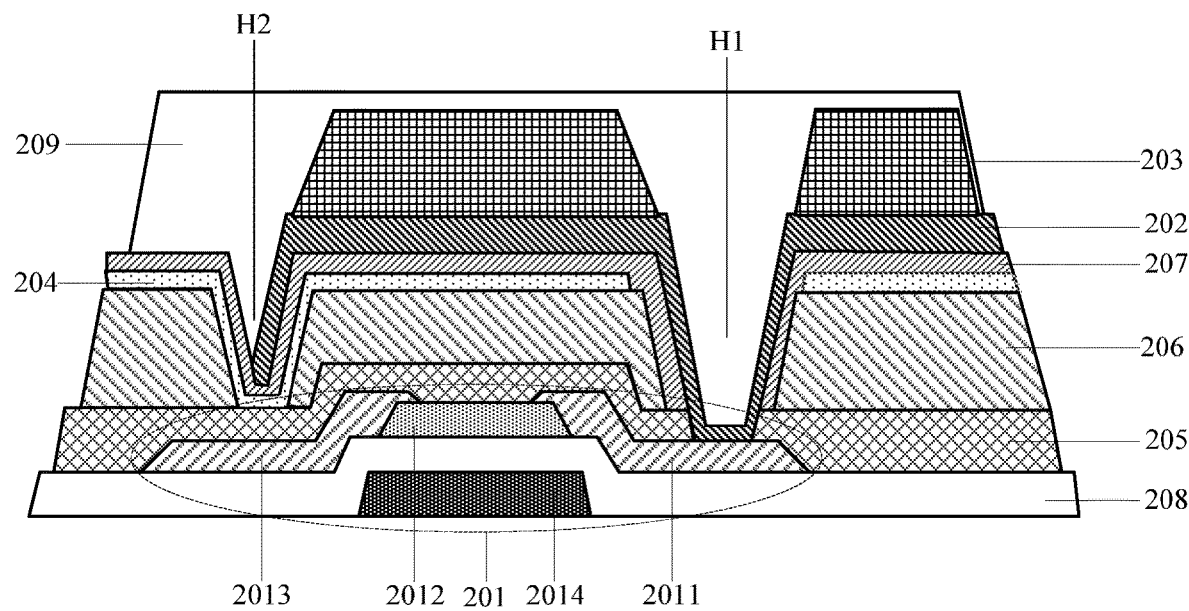
Figure 14:
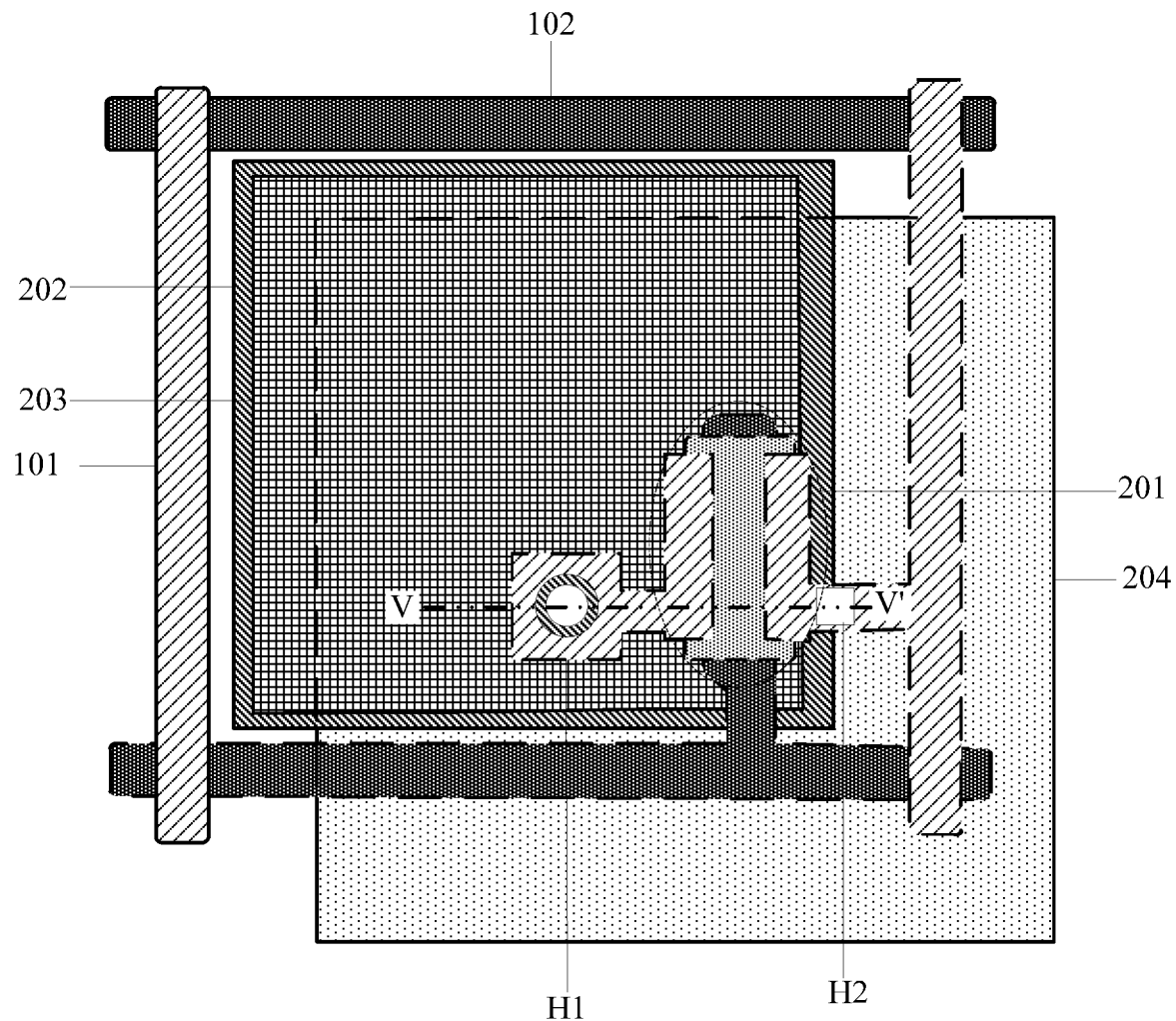
FIG. 14 is a schematic diagram of another top-view structure of a pixel cell on the detection substrate shown in FIG. 1.
Figure 15:
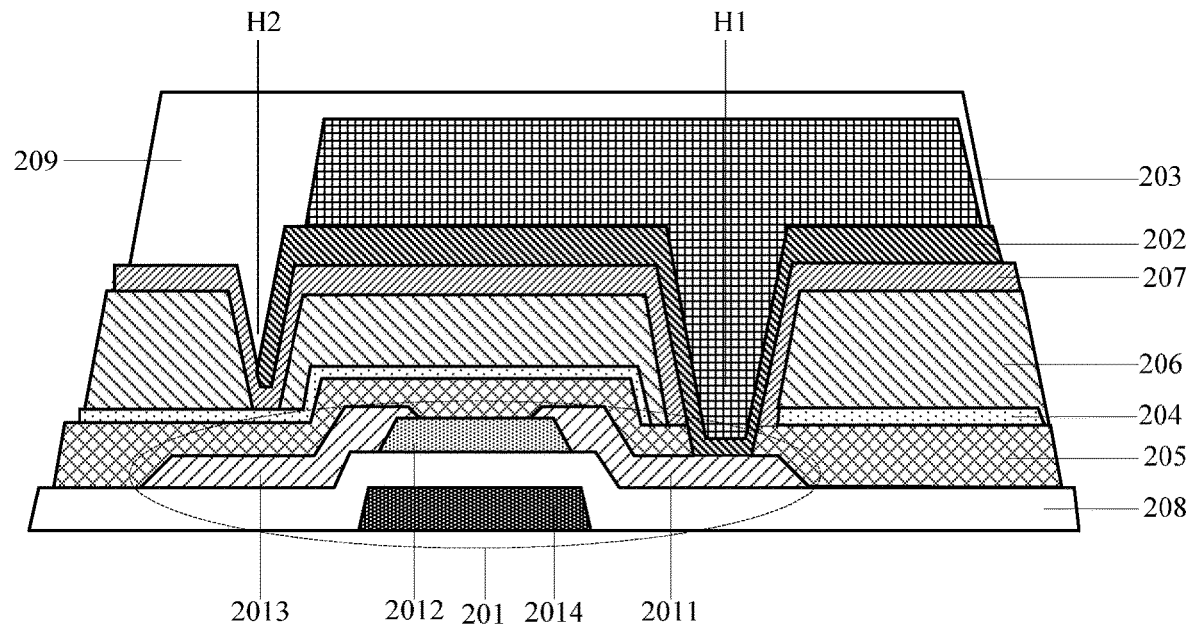
FIGS. 15 and 16 are schematic diagrams of sectional structures along a line V-V' of FIG. 14 respectively.

Optionally, in the detection substrate provided by the embodiments of the present disclosure, in order to improve the pixel fill rate, as shown in FIGS. 11 to 13, an orthographic projection of the photoelectric conversion structures 203 onto the base substrate 100 partially surrounds an orthographic projection of the via H1 onto the base substrate 100. Alternatively, as shown in FIGS. 14 to 16, the orthographic projection of the photoelectric conversion structures 203 onto the base substrate 100 completely surrounds the orthographic projection of the via H1 onto the base substrate 100.

Figure 16:
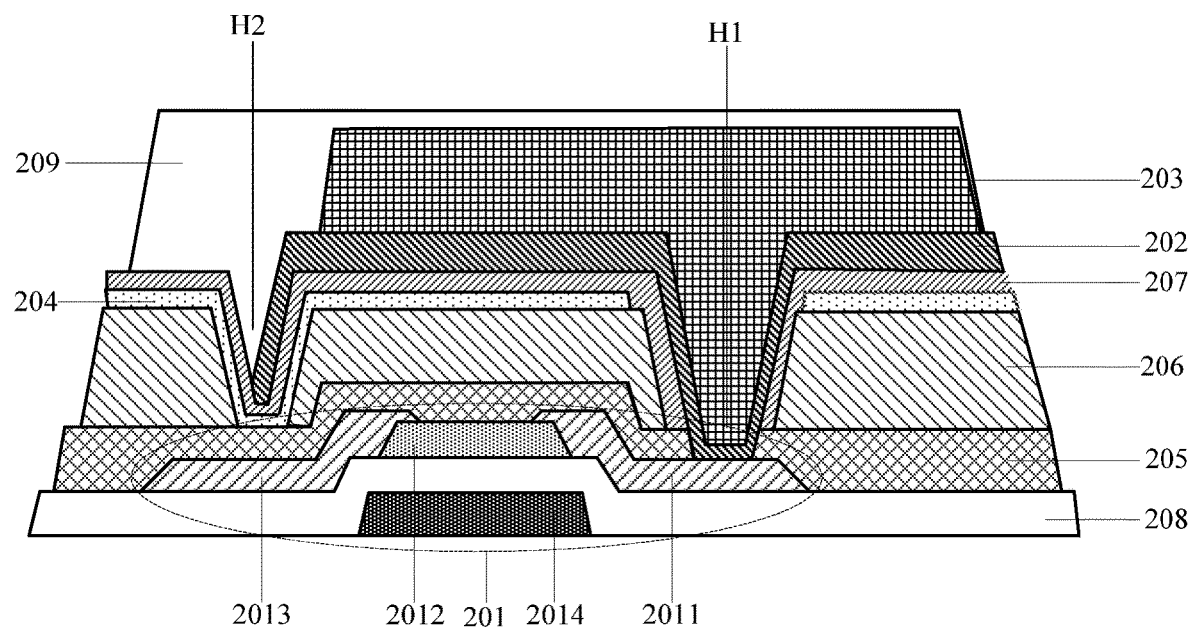
Figure 17:
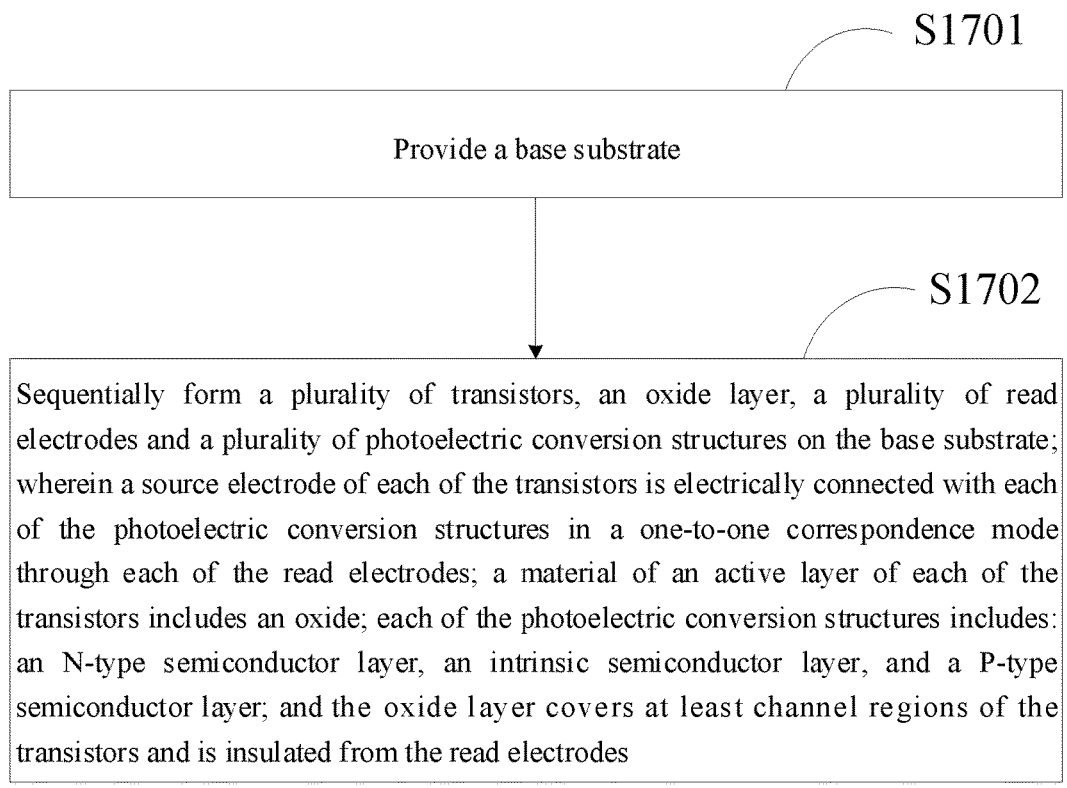
FIG. 17 is a flow diagram illustrating a manufacturing method of the detection substrate according to an embodiment of the present disclosure.

Optionally, the detection substrate provided by the embodiments of the present disclosure, as shown in FIGS. 16 and 17, may also generally include: a gate insulating layer 208 between the gate 2014 and the active layer 2012, and a second resin layer 209 between the bias voltage electrode (not shown) and the bias line (not shown).

In particular, the gate insulating layer 208 is formed from a high dielectric constant material, a dielectric material, other suitable materials, or combinations thereof. Such high dielectric constant material includes, for example, lead oxide, tantalum pentoxide, zirconium dioxide, aluminum oxide, other suitable materials, or combinations thereof. The dielectric material includes, for example, silicon nitride, silicon oxynitride, other suitable materials, or combinations thereof.

The second resin layer 209 can be formed from an organic insulating material or other suitable material. For example, the organic insulating material includes polyacrylic resin, polyepoxy acrylic resin, photosensitive polyimide resin, polyester acrylate, polyurethane acrylate resin, phenolic epoxy acrylic resin, other suitable materials, or combinations thereof.

Based on the same inventive concept, an embodiment of the present disclosure also provides a manufacturing method of a detection substrate, as shown in FIG. 17, including the following steps.

S1701, a base substrate is provided.

S1702, a plurality of transistors, an oxide layer, a plurality of read electrodes, and a plurality of photoelectric conversion structures are sequentially formed on the base substrate.

A first electrode of each of the transistors is electrically connected with each of the photoelectric conversion structures in a one-to-one correspondence mode through each of the read electrodes. A material of an active layer of each of the transistors includes an oxide.

Each of the photoelectric conversion structures includes: an N-type semiconductor layer, an intrinsic semiconductor layer, and a P-type semiconductor layer.

The oxide layer at least covers channel region of the transistor and is insulated from the read electrode.

Optionally, in the manufacturing method provided by the embodiments of the present disclosure, after the step of forming the plurality of transistors on the base substrate is performed, and before the step of forming the plurality of read electrodes is performed, the following step may be further performed.

A first passivation layer, a first resin layer, and a second passivation layer are sequentially formed. The first passivation layer, the first resin layer, and the second passivation layer have mutually penetrating first vias in a region where the first electrode of each of the transistors is located, and the first resin layer has a second via in a region where a second electrode of each of the transistors is located.

Further, mutual insulation between the oxide layer and the read electrodes can be achieved in the following two possible ways.

One possible implementation is: after the step of forming the first passivation layer is performed, and before the step of forming the first resin layer is performed, the oxide layer with a hollow-out structure in a region where the first via is located is formed.

Another possible implementation is: after the step of forming the first resin layer is performed, and before the step of forming the second passivation layer is performed, the oxide layer with the hollow-out structure in a region where the first via is located is formed.

For a better understanding of the detection substrate and the manufacturing method thereof provided by the present disclosure, the following detailed description is made in combination with the specific manufacturing processes of the detection substrate shown in FIGS. 6 and 7.

In particular, the process of manufacturing the detection substrate shown in FIG. 6 is as follows.

Firstly, the base substrate 100 is provided.

Figure 18:
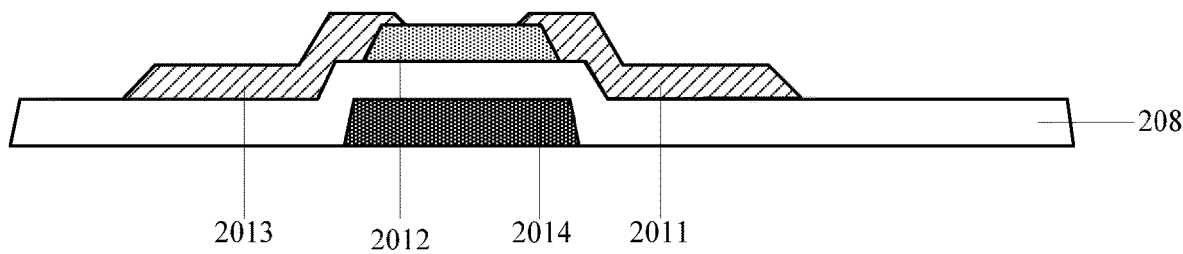
FIGS. 18 to 24 are schematic structural diagrams of a detection substrate corresponding to each step in the process of manufacturing the detection substrate shown in FIG. 6 respectively.

Secondly, a gate metal layer, a gate insulating layer 208, the active layer 2012, and a source-drain metal layer are sequentially manufactured on the base substrate 100. The gate metal layer includes a gate 2014 and a gate line 102 (not shown), and a source second electrode metal layer includes a first electrode 2011, a second electrode 2013, and a data line 101 (not shown), as shown in FIG. 18. The first electrode 2011, the second electrode 2013, the gate 2014, and the active layer 2012 constitute each of the transistors 201. A material of the active layer 2012 is preferably indium gallium zinc oxide.

Figure 19:
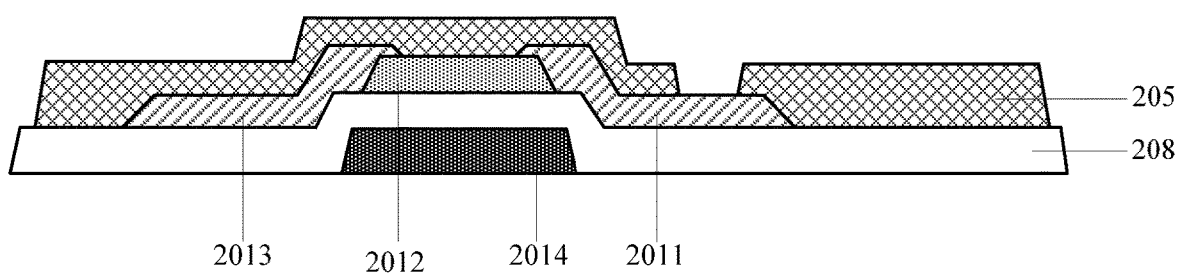

Thirdly, a first passivation layer 205 is formed on a layer with the transistors 201. In particular, the first passivation layer 205 has a first via in the region where the first electrode 2011 is located, as shown in FIG. 19. The first passivation layer 205 may be of a single-layer structure composed of silicon oxide or a laminated structure composed of silicon oxide/silicon nitride/silicon oxynitride.

Figure 20:
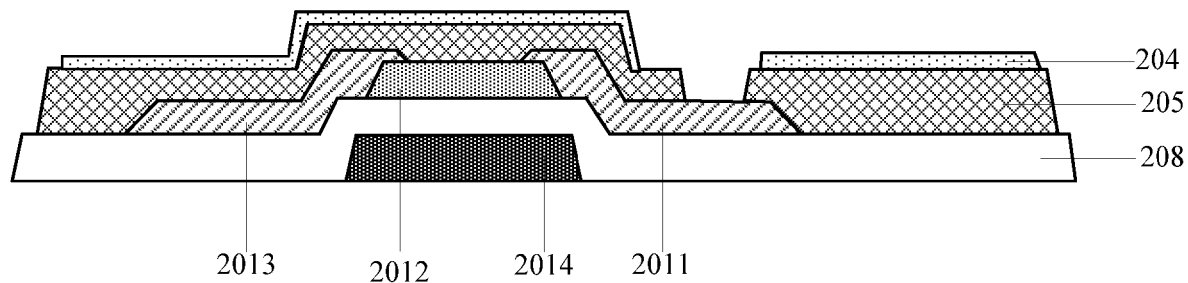

Fourthly, the oxide layer 204 is formed on the first passivation layer 205. The oxide layer 204 has a hollow-out structure in the region where the first electrodes 2011 are located, as shown in FIG. 20. As can be seen from FIG. 20, the oxide layer 204 fully protects the channel region from three directions of the left, top, and right, and blocks the intrusion of a product in the form of out gas into the channel region during subsequent formation of the first resin layer 206. Meanwhile, the oxide layer 204 is combined with hydrogen atoms (H Plasma) generated during subsequent formation of the second passivation layer 207 and the photoelectric conversion structures 203, avoiding the situation that diffusion of the hydrogen atoms into the channel region leads to conducting of the channel region and affects the performance stability of the transistors 201. In addition, the oxide layer 204 may be of an integrated structure covering an entire detection region AA or may be arranged independently in each pixel region. When the oxide layer 204 is disposed independently within each pixel region, preferably, to better achieve protection of the channel region, the channel region may be disposed in a central region of the oxide layer 204. Further, the oxide layer 204 may float, thereby avoiding parasitic capacitance formation between the oxide layer 204 and the transistors 201, and between the oxide layer 204 and the subsequently formed read electrodes 202, avoiding undesirable effects on the transistors 201 and the read electrodes 202.

Figure 21:
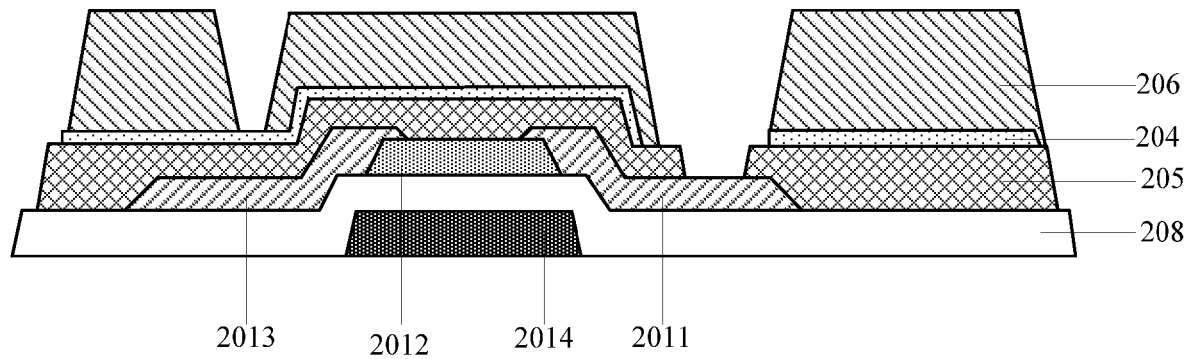

Fifthly, the first resin layer 206 is formed on the oxide layer 204. In particular, the first resin layer 206 has a first via interpenetrating the first passivation layer 205, and the first resin layer 206 has a second via in a region where the second electrodes 2013 are located, as shown in FIG. 21.

Figure 22:
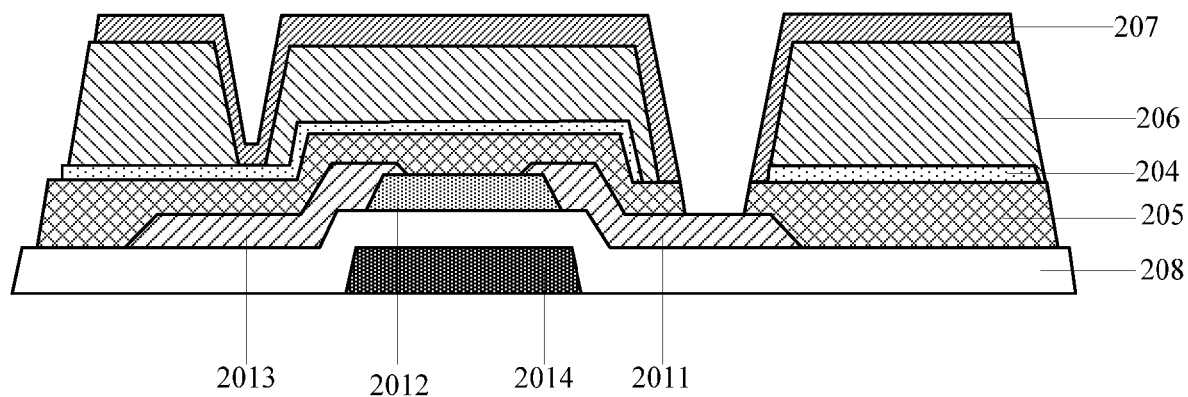

Sixthly, the second passivation layer 207 is formed on the first resin layer 206. In particular, the second passivation layer 207 has a first via interpenetrating the first resin layer 206 and the first passivation layer 205, as shown in FIG. 22. A material of the second passivation layer 207 may be silicon oxide, silicon nitride, and/or silicon oxynitride. The oxide layer 204 may be combined with the hydrogen atoms (H Plasma) generated during formation of the second passivation layer 207, thereby improving the stability of the transistors 201.

Hereto, an insulating layer including the first passivation layer 205, the first resin layer 206 and the second passivation layer 207 is formed, and the insulating layer has a first via in the region where the first electrode 2011 is located, to facilitate subsequently the read electrode 202 being electrically connected with the first electrode 2011 via the first via.

It should be understood that in an actual manufacturing process, the first resin layer 206 and the second passivation layer 207 may also be sequentially deposited on the oxide layer 204, then the second passivation layer 207 is etched, exposing of the first resin layer 206 is performed to form a first via penetrating through the second passivation layer 207 and the first resin layer 206 in the region where the first electrode 2011 is located, and a second via penetrating through the first resin layer 206 in the region where the second electrode 2013 is located.

Figure 23:
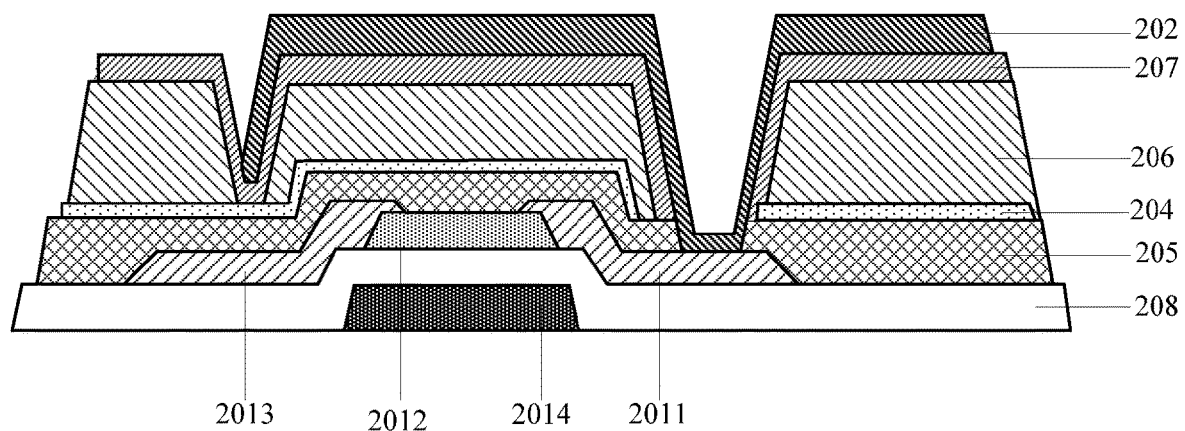

Seventhly, the read electrodes 202 are formed on the second passivation layer 207. In particular, the read electrode 202 is electrically connected with the first electrode 2011 at the first via above the first electrode 2011 and the read electrode 202 covers the right side of the second via above the second electrode 2013, as shown in FIG. 23. Accordingly, the read electrode 202 can block diffusion of the hydrogen atoms (H Plasma) to an active region in a subsequent process (e.g., a manufacturing process of the photoelectric conversion structures 203) from three directions of the left, top and right, thereby ensuring the stability of the transistors 201.

Figure 24:
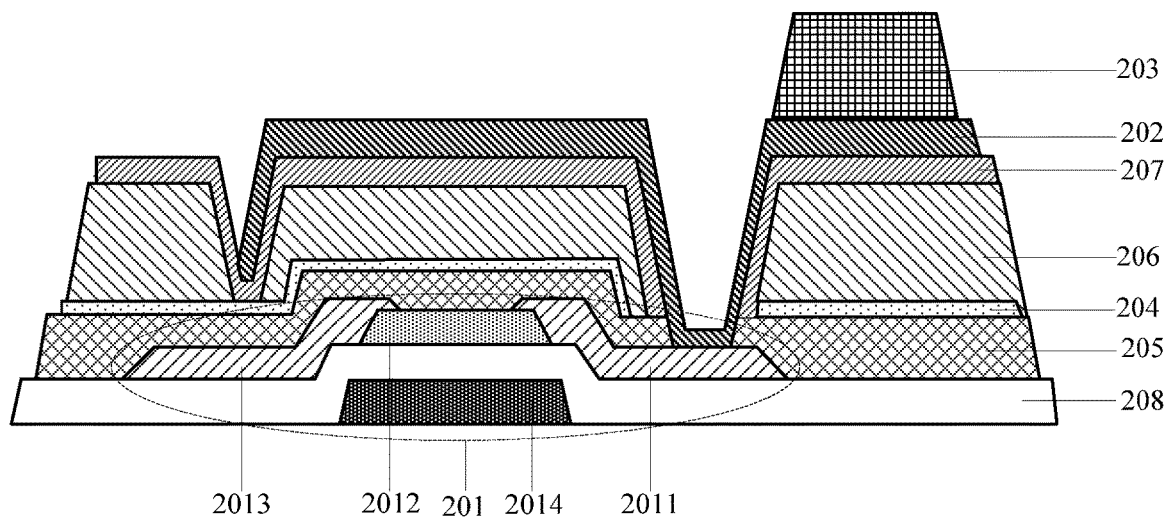

Eighthly, the photoelectric conversion structures 203 electrically connected with the read electrodes 202 in a one-to-one correspondence mode are formed on a layer with each of the read electrodes 202, as shown in FIG. 24. In particular, each of the photoelectric conversion structures 203 includes an N-type semiconductor layer with an N-type impurity, an intrinsic semiconductor layer without an impurity, and a P-type semiconductor layer with a P-type impurity sequentially stacked on the read electrodes 202. A method of forming the photoelectric conversion structures 203 can refer to the related art and will not be described in detail herein.

Ninthly, a second resin layer 209 is formed above a layer with each of the photoelectric conversion structures 203, as illustrated in FIG. 6. In particular, a method for forming the second resin layer 209 can refer to the related art and will not be described in detail herein.

Hereto, preparation of the detection substrate shown in FIG. 6 is completed.

As can be seen from the above description, in the detection substrate shown in FIG. 6 according to the embodiment of the present disclosure, the oxide layer 204 fully protects the channel region from the three directions of the left, top and right and blocks intrusion of a product in the form of out gas into the channel region during the subsequent formation of the first resin layer 206. Meanwhile, the oxide layer 204 is combined with the hydrogen atoms (H Plasma) generated during the formation of the second passivation layer 207 and the photoelectric conversion structures 203, avoiding the situation that diffusion of the hydrogen atoms into the channel region leads to conducting of the channel region and affects the performance stability of the transistors 201. Further, the read electrode 202 blocks diffusion of hydrogen atoms (H Plasma) to the channel region in subsequent processes (e.g., the manufacturing process of the photoelectric conversion structure 203) from the three directions of the left, top and right, further improving the stability of the transistors 201.

In particular, the process of manufacturing the detection substrate shown in FIG. 7 is as follows.

Firstly, the base substrate 100 is provided.

Secondly, the gate metal layer, the gate insulating layer 208, the active layer 2012 and the source-drain metal layer are sequentially manufactured on the base substrate 100. The gate metal layer includes a gate 2014 and a gate line 102 (not shown), and the source second electrode metal layer includes a first electrode 2011, a second electrode 2013, and a data line 101 (not shown), as shown in FIG. 18. The first electrode 2011, the second electrode 2013, the gate 2014, and the active layer 2012 constitute each of the transistors 201. The material of the active layer 2012 is preferably indium gallium zinc oxide.

Thirdly, the first passivation layer 205 is formed on the layer with the transistors 201. In particular, the first passivation layer 205 has a via in the region where the first electrodes 2011 are located, as shown in FIG. 19. The first passivation layer 205 may be of a single-layer structure composed of silicon oxide or a laminated structure composed of silicon oxide/silicon nitride/silicon oxynitride.

Figure 25:
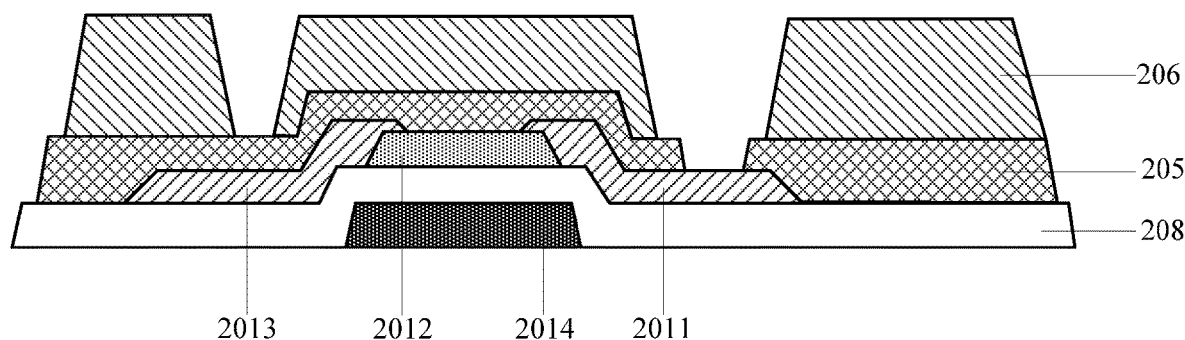
FIGS. 25 to 29 are schematic structural diagrams of a detection substrate corresponding to each step in the process of manufacturing the detection substrate shown in FIG. 7 respectively.

Fourthly, the first resin layer 206 is formed on the first passivation layer 205. In particular, the first resin layer 206 and the first passivation layer 205 have first vias penetrating each other, and the first resin layer 206 has a second via in the region where the second electrodes 2013 are located, as shown in FIG. 25.

Figure 26:
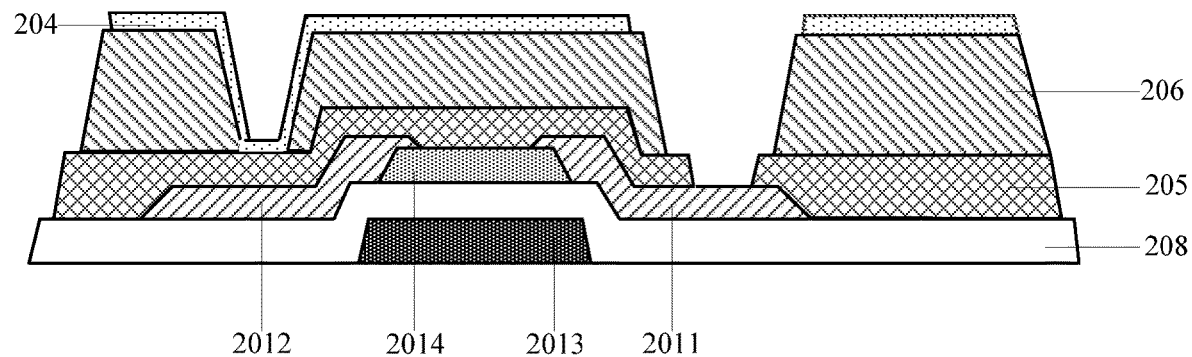

Fifthly, the oxide layer 204 is formed on the first resin layer 206. The oxide layer 204 has a hollow-out structure in the region where the first electrodes 2011 are located, as shown in FIG. 26. As can be seen from FIG. 26, the oxide layer 204 protects the channel region from two directions of the left and the top, and blocks the intrusion of the product in the form of out gas into the channel region during subsequent formation of the first resin layer 206. Meanwhile, the oxide layer 204 is combined with the hydrogen atoms (H Plasma) generated during subsequent formation of the second passivation layer 207 and the photoelectric conversion structures 203, avoiding the situation that diffusion of the hydrogen atoms into the channel region leads to conducting of the channel region and affects the performance stability of the transistors 201. In addition, the oxide layer 204 may be of an integrated structure covering the entire detection region AA or may be arranged independently in each pixel region. When the oxide layer 204 is disposed independently within each pixel region, preferably, to better achieve protection of the channel region, the channel region may be disposed in the central region of the oxide layer 204. Further, the oxide layer 204 may float, thereby avoiding parasitic capacitance formation between the oxide layer 204 and the transistors 201, and between the oxide layer 204 and the subsequently formed read electrodes 202, avoiding undesirable effects on the transistors 201 and the read electrodes 202.

Figure 27:
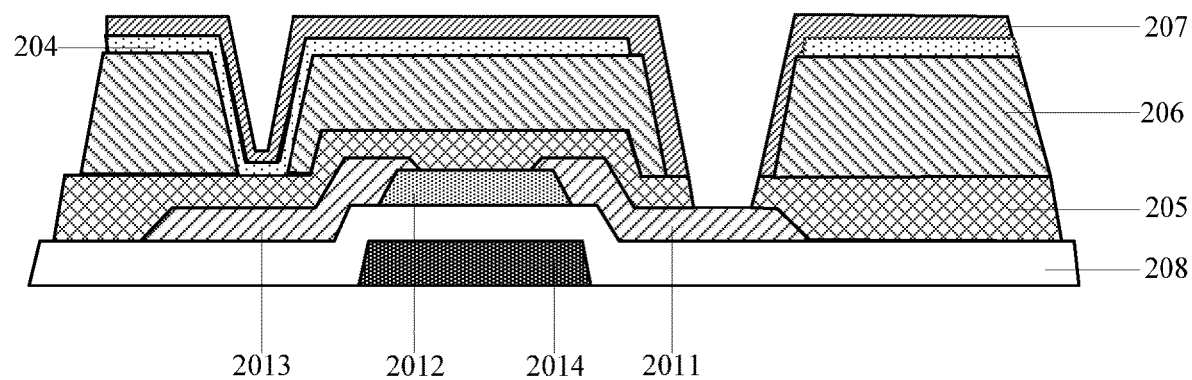

Sixthly, the second passivation layer 207 is formed on the oxide layer 204. In particular, the second passivation layer 207 has a first via interpenetrating the first resin layer 206 and the first passivation layer 205, as shown in FIG. 27. A material of the second passivation layer 207 may be silicon oxide, silicon nitride, and/or silicon oxynitride. The oxide layer 204 may be combined with the hydrogen atoms (H Plasma) generated during formation of the second passivation layer 207, thereby improving the stability of the transistors 201.

Hereto, the insulating layer including the first passivation layer 205, the first resin layer 206 and the second passivation layer 207 is formed, and the insulating layer has a first via in the region where the first electrode 2011 is located so as to facilitate subsequently the read electrode 202 to be electrically connected with the first electrode 2011 via the first via.

It should be understood that in the actual manufacturing process, the first passivation layer 205 and the first resin layer 206 may also be sequentially deposited on the layer with the transistors 201, and after exposing the first resin layer 206, the first passivation layer 207 is etched to form the first via penetrating through the first passivation layer 205 and the first resin layer 206 in the region where the first electrodes 2011 are located, and a second via penetrating through the first resin layer 206 in a region where the second electrode 2013 is located.

Figure 28:
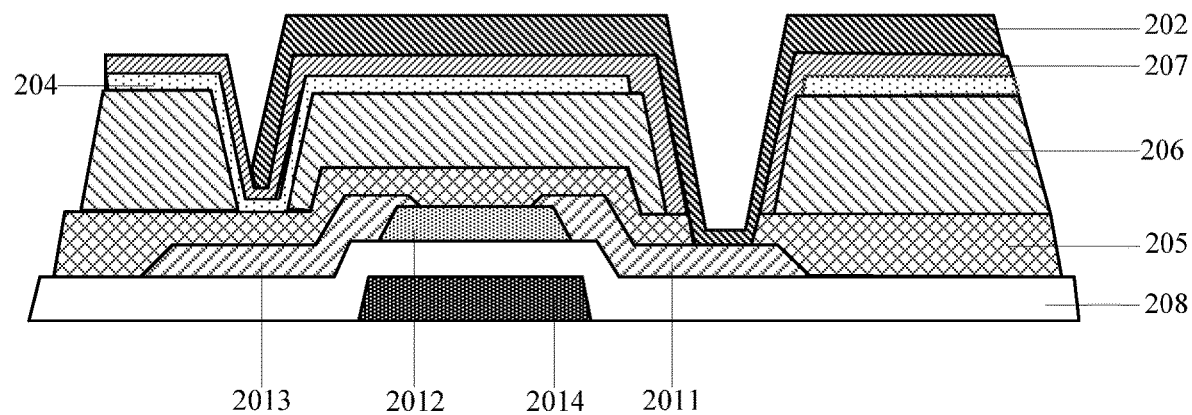

Seventhly, the read electrodes 202 are formed on the second passivation layer 207. In particular, the read electrode 202 is electrically connected with the first electrode 2011 at the first via above the first electrode 2011 and the read electrode covers the right side of the second via above the second electrode 2013, as shown in FIG. 28. Accordingly, the read electrode 202 can block diffusion of the hydrogen atoms (H Plasma) to the active region in a subsequent process (e.g., the manufacturing process of the photoelectric conversion structures 203) from the three directions of the left, top and right, thereby ensuring the stability of the transistors 201.

Figure 29:
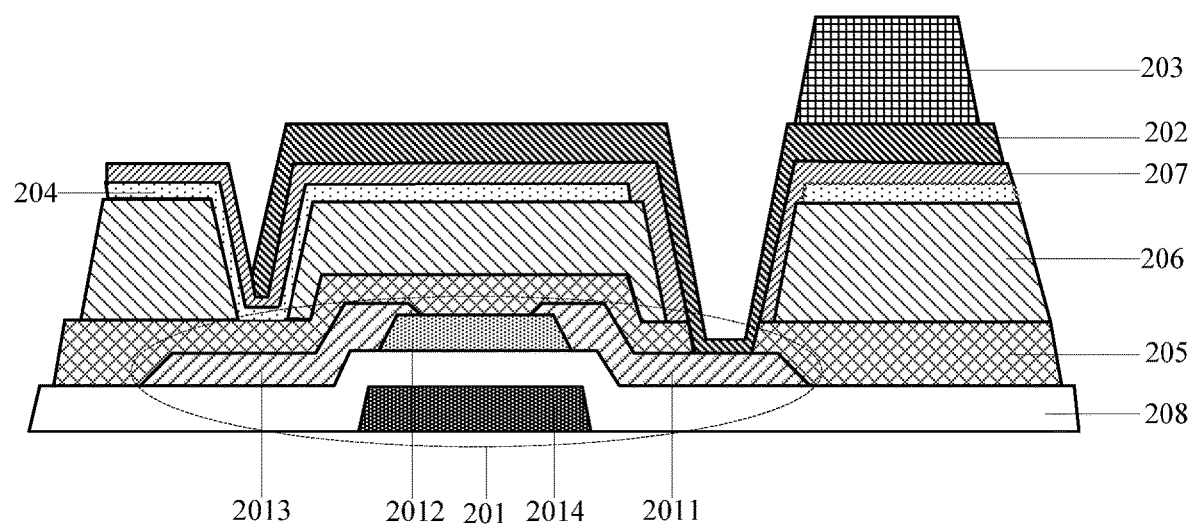

Eighthly, the photoelectric conversion structures 203 electrically connected with each of the read electrodes 202 in a one-to-one correspondence mode are formed on the layer with each of the read electrodes 202, as shown in FIG. 29. In particular, each of the photoelectric conversion structures 203 includes the N-type semiconductor layer with the N-type impurity, the intrinsic semiconductor layer without the impurity, and the P-type semiconductor layer with the P-type impurity sequentially stacked on the read electrodes 202. A method for forming the photoelectric conversion structures 203 can refer to the related art and will not be described in detail herein.

Ninthly, the second resin layer 209 is formed above the layer with each of the photoelectric conversion structures 203, as illustrated in FIG. 7. In particular, a method for forming the second resin layer 209 can refer to the related art and will not be described in detail herein.

Hereto, preparation of the detection substrate shown in FIG. 7 is completed.

As can be seen from the above description, in the detection substrate shown in FIG. 7 according to the embodiment of the present disclosure, the oxide layer 204 fully protects the channel region from the two directions of the left and the top, and blocks the intrusion of the product in the form of out gas into the channel region during the subsequent formation of the first resin layer 206. Meanwhile, the oxide layer 204 is combined with the hydrogen atoms (H Plasma) generated during formation of the second passivation layer 207 and the photoelectric conversion structures 203, avoiding the situation that diffusion of hydrogen atoms into the channel region leads to conducing of the channel region and affects the performance stability of the transistors 201. Further, the read electrodes 202 block diffusion of the hydrogen atoms (H Plasma) into the channel region in subsequent processes (e.g., the manufacturing process of the photoelectric conversion structures 203) from the three directions of the left, top and right, further improving the stability of the transistors 201.

On the basis of the same inventive concept, an embodiment of the present disclosure also provides a flat panel detector that can be implemented with reference to the implementations of the above detection substrate provided by the embodiments of the present disclosure since the principles of solving problems of the flat panel detector are similar to the principles of solving problems of the detection substrate, and the repetition is omitted.

The detection substrate, the manufacturing method thereof, and the flat panel detector disclosed herein, including: the base substrate, the plurality of transistors on the base substrate, the plurality of read electrodes on a side of each of the transistors away from the base substrate, the plurality of photoelectric conversion structures on a side of each of the read electrodes away from the transistors, and the oxide layer between the layer with each of the transistors and the layer with each of the read electrodes. The first electrode of each of the transistors is electrically connected with each of the photoelectric conversion structures in a one-to-one correspondence mode through each of the read electrodes. The material of the active layer of each of the transistors includes the oxide. Each of the photoelectric conversion structures includes: the N-type semiconductor layer, the intrinsic semiconductor layer, and the P-type semiconductor layer. The oxide layer at least covers the channel region of the transistor and is insulated from the read electrode. The oxide layer covering the channel region of the transistor is arranged between the layer with each of the transistors and the layer with each of the read electrodes so that the hydrogen atoms generated during subsequent deposition of the photoelectric conversion structures are allowed to react with the oxide layer and are thereby consumed by the oxide layer, avoiding the hydrogen atoms reaching the channel region, effectively improving the stability of the transistors and improving the performance of the flat panel detector.

It will be apparent to those skilled in the art that various modifications and variations can be made to the present disclosure without departing from the spirit and scope of the present disclosure. In this case, if such modifications and variations of the present disclosure fall within the scope of claims and their equivalents, the present disclosure intends to include these modifications and the variations.

What is claimed is:

1. A detection substrate, comprising:
   a base substrate;
   a plurality of transistors on the base substrate;
   a plurality of read electrodes on a side of each of the transistors away from the base substrate;
   a plurality of photoelectric conversion structures on a side of each of the read electrodes away from the transistors;
   an oxide layer on the side of each of the transistors away from the base substrate and on a side of each of the read electrodes facing the transistors; and
   an insulating layer on the side of each of the transistors away from the base substrate and on the side of each of the read electrodes facing the transistors;
   wherein the insulating layer comprises:
      a first passivation layer on the side of each of the transistors away from the base substrate and on a side of the oxide layer facing the transistors;
      a first resin layer on a side of the oxide layer away from the transistors and on the side of each of the read electrodes facing the transistors; and
      a second passivation layer on a side of the first resin layer away from the oxide layer and on the side of each of the read electrodes facing the transistors;
   wherein:
   a first electrode of each of the transistors is electrically connected with each of the photoelectric conversion structures in a one-to-one correspondence mode via each of the read electrodes;
   a material of an active layer of each of the transistors comprises an oxide;
   each of the photoelectric conversion structures comprises:
      an N-type semiconductor layer, an intrinsic semiconductor layer, and a P-type semiconductor layer;
   the oxide layer at least covers channel regions of the transistors and is insulated from the read electrodes;
   the first resin layer has a first via in a region where a second electrode of the transistor is located, and the second passivation layer covers the first via, and the read electrode at least covers part of the first via; and
   an orthographic projection of the oxide layer onto the base substrate covers an orthographic projection of the first via onto the base substrate.

2. The detection substrate according to claim 1, wherein:
   the first electrode of the transistor is electrically connected with the read electrode through a second via penetrating through the insulating layer; and
   the oxide layer has a hollow-out structure in a region where the second via is located.

3. The detection substrate according to claim 1, wherein a region with the transistor and the photoelectric conversion structure electrically connected is a pixel region; and
   the oxide layer corresponding to each pixel region is of an integrated structure.

4. The detection substrate according to claim 1, wherein a region with the transistor and the photoelectric conversion structure electrically connected is a pixel region; and
   the respective oxide layers corresponding to the respective pixel regions are independent from one another.

5. The detection substrate according to claim 4, wherein the channel region of the transistor is in a central region of the oxide layer within each of the pixel regions.

6. The detection substrate according to claim 1, wherein a material of the oxide layer is indium tin oxide.

7. The detection substrate according to claim 1, wherein a material of the active layer of each of the transistors is indium gallium zinc oxide.

8. A flat panel detector, comprising: a detection substrate according to claim 1.

9. A manufacturing method of a detection substrate, wherein the detection substrate is according to claim 1, and the manufacturing method comprises:
   providing a base substrate; and
   sequentially forming a plurality of transistors, an oxide layer, a plurality of read electrodes, and a plurality of photoelectric conversion structures on the base substrate;
   wherein:
   a first electrode of each of the transistors is electrically connected with each of the photoelectric conversion structures in a one-to-one correspondence mode via each of the read electrodes;
   a material of an active layer of each of the transistors comprises an oxide;
   each of the photoelectric conversion structures comprises:
      an N-type semiconductor layer, an intrinsic semiconductor layer, and a P-type semiconductor layer; and
   the oxide layer at least covers channel regions of the transistors and is insulated from the read electrodes.

10. The manufacturing method according to claim 9, after forming the plurality of transistors on the base substrate and before forming the plurality of read electrodes, further comprising:
    sequentially forming a first passivation layer, a first resin layer, and a second passivation layer;
    wherein the first passivation layer has a second via penetrating through the first resin layer and the second passivation layer in a region with the first electrode of each of the transistors, and the first resin layer has a first via in a region with a second electrode of each of the transistors.

11. The manufacturing method according to claim 10, wherein forming the oxide layer comprises:

after forming the first passivation layer, and before forming the first resin layer, forming the oxide layer with a hollow-out structure in a region where the second via is located.

12. The detection substrate according to claim 2, wherein a region with the transistor and the photoelectric conversion structure electrically connected is a pixel region; and
the oxide layer corresponding to each pixel region is of an integrated structure.

13. The detection substrate according to claim 2, wherein a region with the transistor and the photoelectric conversion structure electrically connected is a pixel region; and
the respective oxide layers corresponding to the respective pixel regions are independent from one another.

* * * * *